United States Patent
Ishii

(10) Patent No.: US 10,706,902 B2
(45) Date of Patent: Jul. 7, 2020

(54) SEMICONDUCTOR DEVICE

(71) Applicant: RENESAS ELECTRONICS CORPORATION, Tokyo (JP)

(72) Inventor: Yuichiro Ishii, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/192,272

(22) Filed: Nov. 15, 2018

(65) Prior Publication Data

US 2019/0198074 A1    Jun. 27, 2019

(30) Foreign Application Priority Data

Dec. 22, 2017   (JP) ................. 2017-246745

(51) Int. Cl.

| | | |
|---|---|---|
| G11C 8/16 | (2006.01) | |
| G11C 11/408 | (2006.01) | |
| G11C 8/08 | (2006.01) | |
| G11C 11/417 | (2006.01) | |
| G11C 7/10 | (2006.01) | |
| H01L 27/11 | (2006.01) | |
| G11C 8/14 | (2006.01) | |
| G11C 7/12 | (2006.01) | |
| G11C 11/419 | (2006.01) | |
| G11C 7/02 | (2006.01) | |
| G11C 5/06 | (2006.01) | |

(52) U.S. Cl.
CPC ............. *G11C 8/08* (2013.01); *G11C 7/02* (2013.01); *G11C 7/1078* (2013.01); *G11C 7/12* (2013.01); *G11C 8/14* (2013.01); *G11C 8/16* (2013.01); *G11C 11/417* (2013.01); *G11C 11/419* (2013.01); *H01L 27/1104* (2013.01); *G11C 5/063* (2013.01); *G11C 11/4085* (2013.01)

(58) Field of Classification Search
CPC .............................. G11C 8/16; G11C 11/4085
USPC ................................................ 365/51, 230.05
See application file for complete search history.

(56) References Cited

U.S. PATENT DOCUMENTS

| 5,966,317 A | 10/1999 | O'Connor |
|---|---|---|
| 6,307,788 B1 | 10/2001 | Tanaka |

(Continued)

FOREIGN PATENT DOCUMENTS

| JP | 2000-012704 A | 1/2000 |
|---|---|---|
| JP | 2000-236029 A | 8/2000 |
| JP | 2009-076931 A | 4/2009 |

*Primary Examiner* — Son L Mai
(74) *Attorney, Agent, or Firm* — McDermott Will & Emery LLP

(57) ABSTRACT

A semiconductor device includes: memory cells, first word lined arranged for first ports and each arranging corresponding to respective rows of the memory cells; second word lines arranged for second ports and each arranged corresponding to respective rows of the memory cells, first dummy word lines each provided above the respective first word lines, second dummy word lines each provided above the respective second word lines, a word line driver driving the first and second word lines, and a dummy word line driver driving, in an opposite phase, the second dummy word line for the adjacent second word line according to driving of the first word line from among the first and second word lines, or the first dummy word line for the adjacent first word line according to driving of the second word line from among the first and second word lines.

8 Claims, 16 Drawing Sheets

(56) References Cited

U.S. PATENT DOCUMENTS

| | | | |
|---|---|---|---|
| 6,317,365 B1 | 11/2001 | Tanaka | |
| 6,370,054 B1 * | 4/2002 | Fujisawa | G11C 5/025 |
| | | | 257/E27.097 |
| 6,917,560 B2 | 7/2005 | Nii | |
| 8,000,123 B2 * | 8/2011 | Okahiro | G11C 11/4097 |
| | | | 365/63 |
| 8,958,258 B2 * | 2/2015 | Okuma | G11C 8/14 |
| | | | 365/201 |

* cited by examiner

SEMICONDUCTOR DEVICE

CROSS-REFERENCE TO RELATED APPLICATIONS

The disclosure of Japanese Patent Application No. 2017-246745 filed on Dec. 22, 2017 including the specification, drawings and abstract is incorporated herein by reference in its entirety.

BACKGROUND

The present invention relates to a semiconductor device, and more particularly, to a semiconductor device of a static random access memory (SRAM) having a multiport memory.

In a multiport memory cell, the bit lines or word lines of each port tend to be adjacent to each other. Thus, a coupling capacitance between wires may cause crosstalk, leading to a malfunction.

For example, Japanese Unexamined Patent Application Publication No. 2000-12704 proposes a method of avoiding interference between a writing word line and a reading word line by providing a GND wire for the word lines. Similarly, Japanese Unexamined Patent Application Publication No. 2000-236029 proposes a method of avoiding interference between word lines by providing a GND wire between the adjacent rows of a memory cell.

In these methods, however, the shield wire is provided between the word lines and thus the word lines need to be sufficiently spaced. If the word lines are initially spaced in a memory cell, the provision of shield wires does not increase the area of the memory cell.

Moreover, in the technique of Japanese Unexamined Patent Application Publication No. 2009-76931, two word lines adjacent to an unselected word line are not simultaneously selected (activated) because of the pattern of the word lines.

However, the word lines of both ports are not adjacent to each other also in this configuration, thereby less effectively reducing coupling noise between selected word lines.

SUMMARY

The present disclosure is devised to solve the problem and provides a semiconductor device that can reduce coupling noise while suppressing an area increase.

The semiconductor device includes memory cells arranged in rows and columns, and first and second word lines for first and second ports arranged for each memory cell row. Furthermore, the semiconductor device includes a plurality of first dummy word lines each provided above the respective first word lines, a plurality of second dummy each word lines provided above the respective second word lines, and a word line driver which drives the first and second word lines. Moreover, the semiconductor device includes a dummy word line driver for driving, in an opposite phase, the second dummy word line for the adjacent second word line according to driving of the first word line from among the first and second word lines by means of the word line driver, or the first dummy word line for the adjacent first word line according to driving of the second word line from among the first and second word lines by means of the word line driver.

According to an embodiment, the semiconductor device can reduce coupling noise while suppressing an area increase.

DETAILED DESCRIPTION

Figure 1:
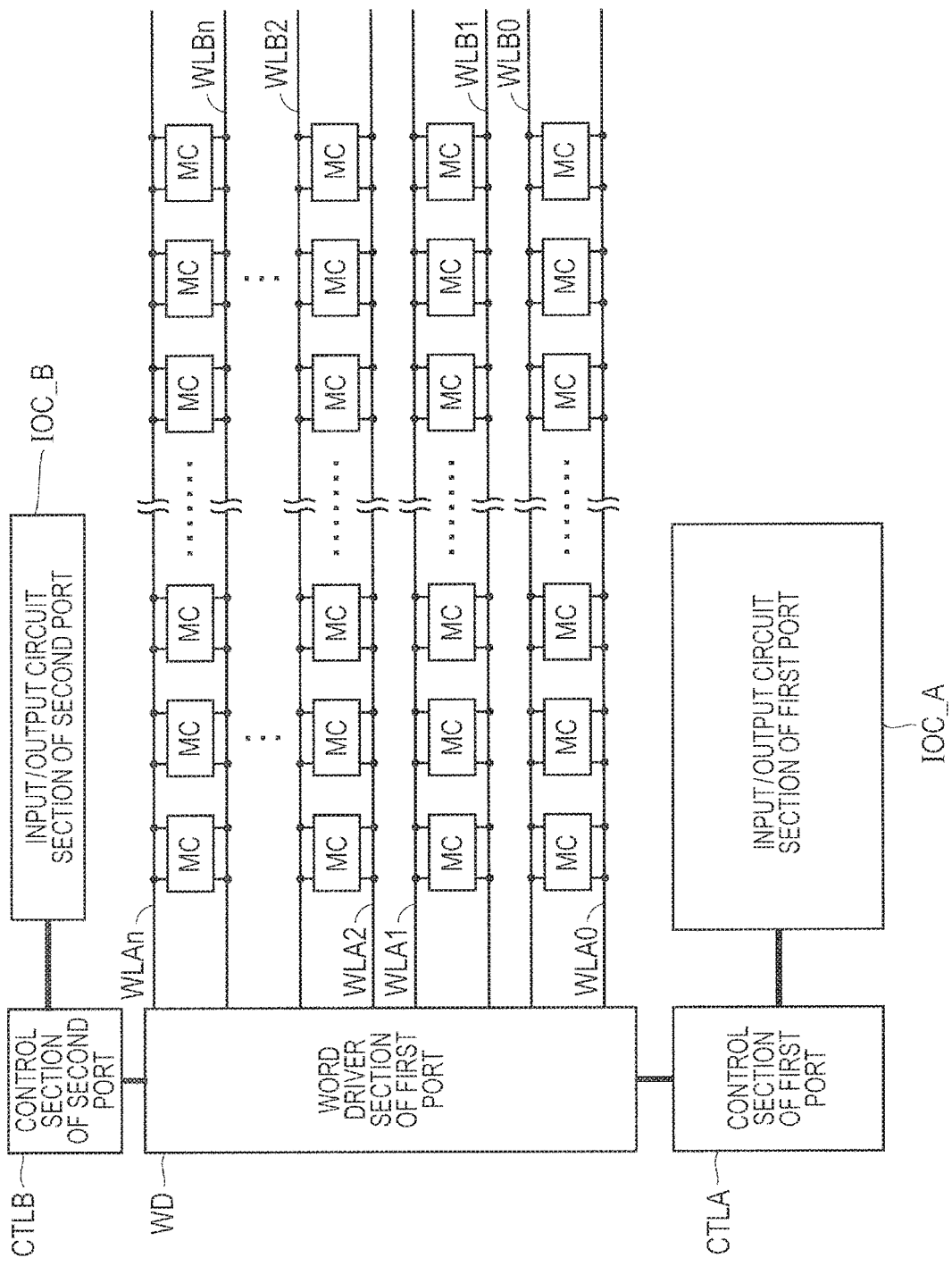
FIG. 1 is a block diagram for explaining the configuration of a semiconductor device according to a first embodiment.

Embodiments will be specifically described below with reference to the accompanying drawings. The same or equivalent parts in the drawings are indicated by the same reference numerals and the explanation thereof is not repeated.

First Embodiment

FIG. 1 is a block diagram showing the configuration of a semiconductor device according to a first embodiment.

Referring to FIG. 1, the semiconductor device in FIG. 1 includes a plurality of memory cells MC arranged in rows and columns (matrix), word driver sections WD, a control section CTLA, an input/output circuit section IOC_A, a control section CTLB, and an input/output circuit section IOC_B. The word driver sections, the control sections, and the input/output circuit sections are provided for first and second ports (port A, port B).

The word driver section WD drives a plurality of word lines WLA arranged along the row direction. Moreover, the word driver section WD drives a plurality of word lines WLB arranged along the row direction.

The input/output circuit section IOC_A reads and writes information on a bit line pair (BLA/BLA) for the port A coupled to the memory cells MC, whereas the input/output circuit section IOC_B reads and writes information on a bit line pair for the port B coupled to the memory cells MC. In FIG. 1, the bit line pairs are omitted for convenience.

The control section CTLA controls a plurality of word driver circuits included in the word driver section WD for the first port, in response to an external address signal inputted for the port A.

The control section CTLA further controls a plurality of reading circuits (e.g., a sense amplifier circuit) or writing circuits that are included in the input/output circuit section IOC_A.

The control section CTLB controls a plurality of word driver circuits included in the word driver section WD for the second port, in response to an external address signal inputted for the port B. The control section CTLB also controls a plurality of reading circuits or writing circuits (not shown) that are included in the input/output circuit section IOC_B.

In this configuration, the semiconductor device according to the first embodiment includes the word lines WLA and WLB that are alternately placed in the rows, for example, in the order of WLA0, WLB0, WLA1, and WLA2.

The word line WLA in one row is adjacent to the word line WLA in the right (or left) row, whereas the word line WLB in one row is adjacent to the word line WLB in the left (or right) row.

Figure 2:
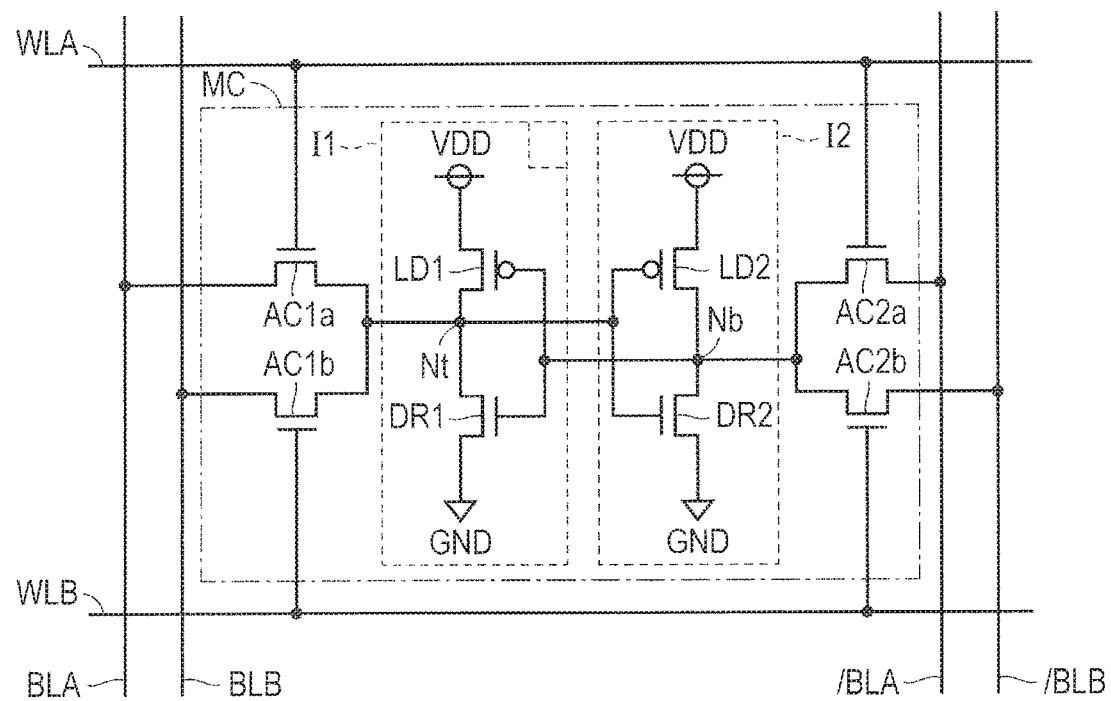
FIG. 2 is a circuit diagram showing a configuration example of a memory cell MC according to the first embodiment.

FIG. 2 is a circuit diagram showing a configuration example of the memory cell MC according to the first embodiment.

As shown in FIG. 2, the memory cell MC is a SRAM memory cell.

The memory cell MC includes two driver transistors DR1 and DR2, two load transistors LD1 and LD2, and four access transistors AC1a, AC1b, AC2a, and AC2b.

In this configuration, the driver transistors DR1 and DR2 and the access transistors AC1a, AC1b, AC2a, and AC2b include NMOS transistors while the load transistors LD1 and LD2 include PMOS transistors.

The load transistor LD1 and the driver transistor DR1 include a first complementary metal-oxide semiconductor (CMOS) inverter 11. The load transistor LD2 and the driver transistor DR2 include a second CMOS inverter 12.

The output terminals of the first and second inverters 11 and 12 are each coupled to the input terminal of the other inverter. Thus, the first and second inverters 11 and 12 include a 1-bit latch circuit that holds complementary storage information in a storage node Nt and an inverted storage node Nb. The sources of the driver transistors DR1 and DR2 are each coupled to a ground voltage GND while the sources of the load transistors LD1 and LD2 are each coupled to a power supply voltage VDD.

The access transistor AC1a couples the storage node Nt and the bit line BLA for the port A when the word line WLA for the port A is activated. The access transistor AC2a couples the inverted storage node Nb and an inverted bit line /BLA for the port A when the word line WLA is activated.

Similarly, the access transistor AC1b couples the storage node Nt and the bit line BLB for the port B when the word line WLB for the port B is activated. The access transistor AC2b couples the inverted storage node Nb and an inverted bit line /BLB for the port B when the word line WLB is activated.

The bit lines BLA and /BLA include the bit line pair for the port A. The bit lines BLB and /BLB include the bit line pair for the port B.

The word lines WLA and WLB are arranged along the row direction. The bit lines BLA, /BLA, BLB, and /BLB are arranged along the column direction. Each row includes a set of word lines including the two word lines WLA and WLB.

Each column includes a set of bit lines including the four bit lines BLA, /BLA, BLB, and /BLB.

The memory cell MC is arranged at each of the intersections of the rows (word lines) and the columns (bit lines).

Figure 3:
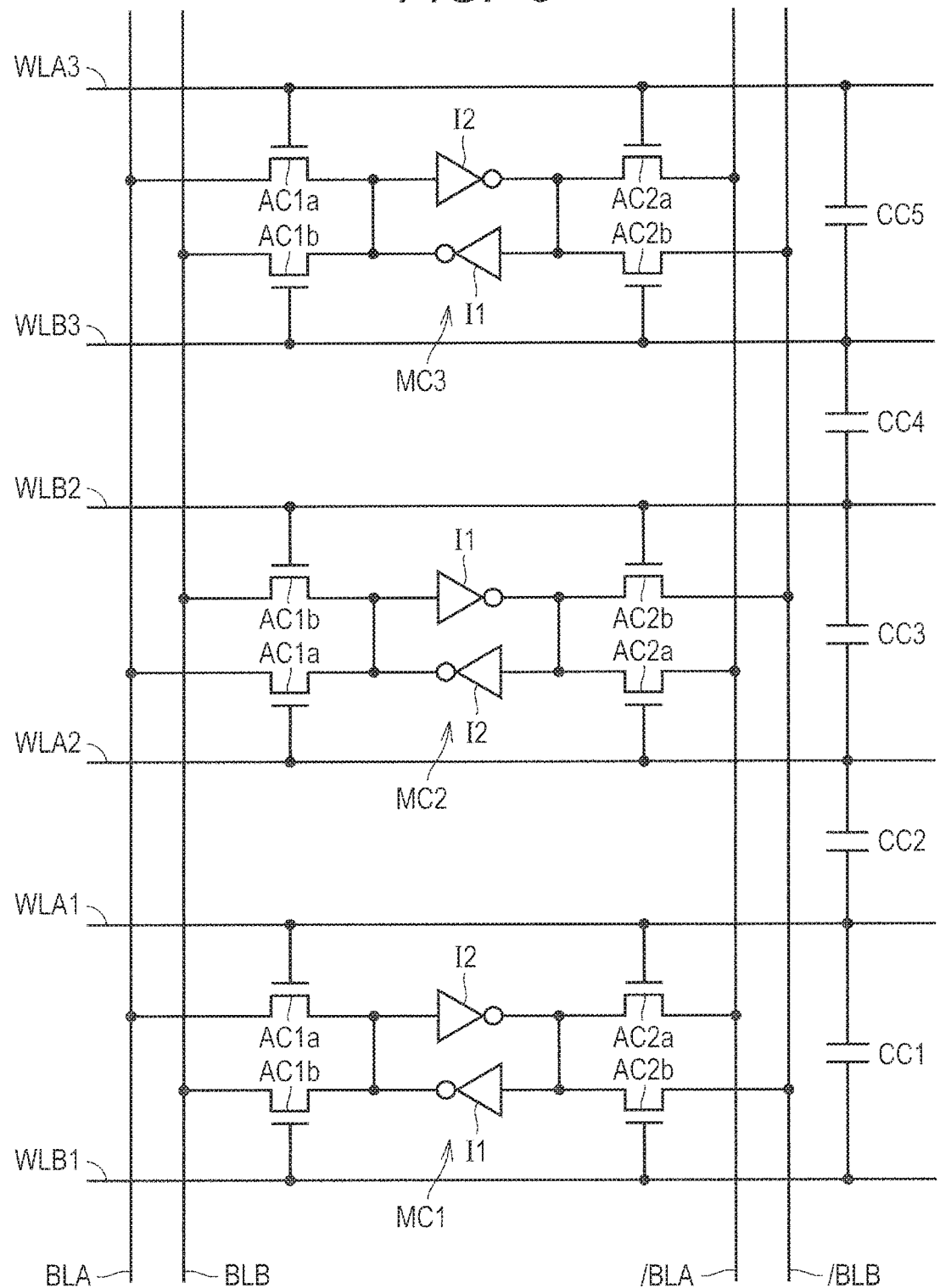
FIG. 3 is an explanatory drawing showing the memory array of the semiconductor device according to the first embodiment.

FIG. 3 is an explanatory drawing showing the memory array of the semiconductor device according to the first embodiment.

Referring to FIG. 3, the memory cells MC1 to MC3 are sequentially arranged in three rows on the same column (bit lines BLA, /BLA, BLB, and /BLB).

The word lines WLA1 and WLB1 are coupled to the memory cell MC1.

The word lines WLA2 and WLB2 are coupled to the memory cell MC2.

The word lines WLA3 and WLB3 are coupled to the memory cell MC3.

The word lines WLB1, WLA1, WLA2, WLB2, WLB3, and WLA3 are sequentially arranged along the row direction.

For example, the word line WLA1 interferes with the word line WLB1 through a parasitic capacitance (coupling capacitance) CC1 and interferes with the word line WLA2 through a parasitic capacitance CC2.

The word lines WLA1 and WLB1 may have signal transitions (activation or inactivation) in the same cycle in response to an asynchronous operation.

The word lines WLA1 and WLA2 do not have signal transitions in the same cycle.

Figure 4:
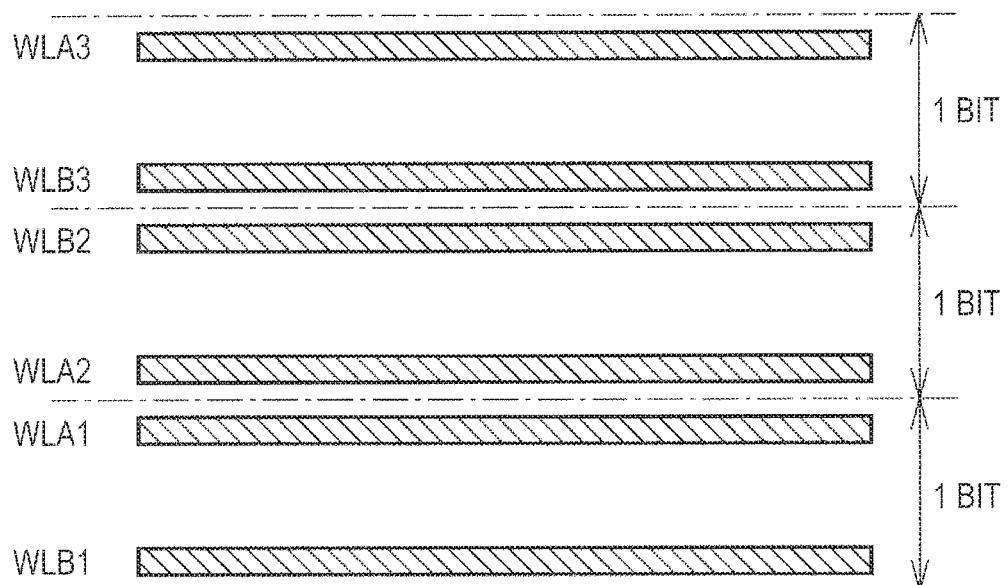
FIG. 4 is a plan view showing a layout configuration in which only the word lines are extracted according to the first embodiment.

FIG. 4 is a plan view showing a layout configuration in which only the word lines are extracted according to the first embodiment.

Referring to FIG. 4, 1-bit cells are placed for 3 bits along the row direction.

In this case, the word lines are widely spaced in the cell, whereas the word lines (WLA and WLA or WLB and WLB) are narrowly spaced between the cells.

Figure 5:
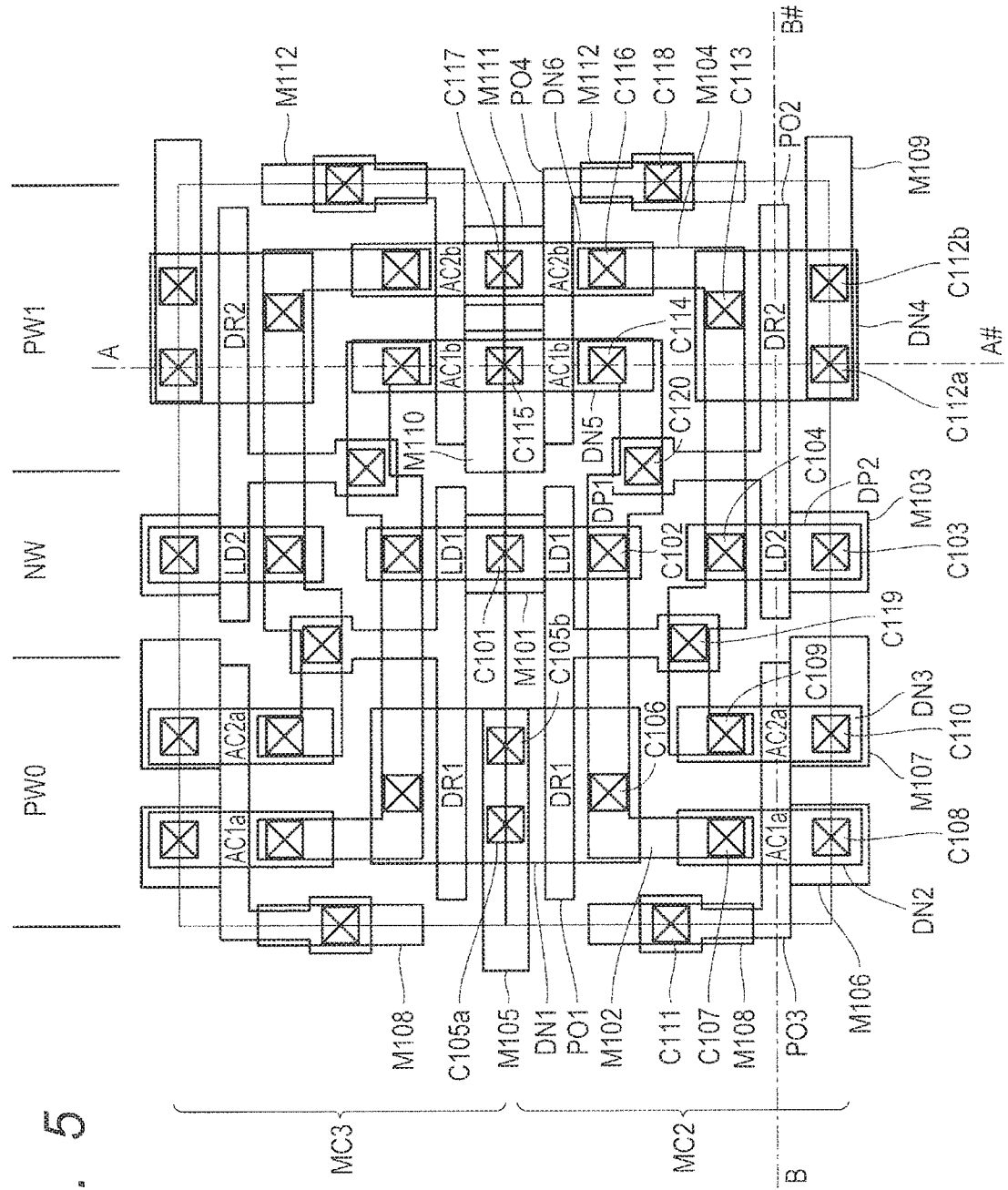
FIG. 5 is a plan view showing a layout configuration example including memory cells MC2 and MC3 in the second and third rows shown in FIG. 3.

FIG. 5 is a plan view showing a layout configuration example including the memory cells MC2 and MC3 in the second and third rows shown in FIG. 3.

Figure 6A:
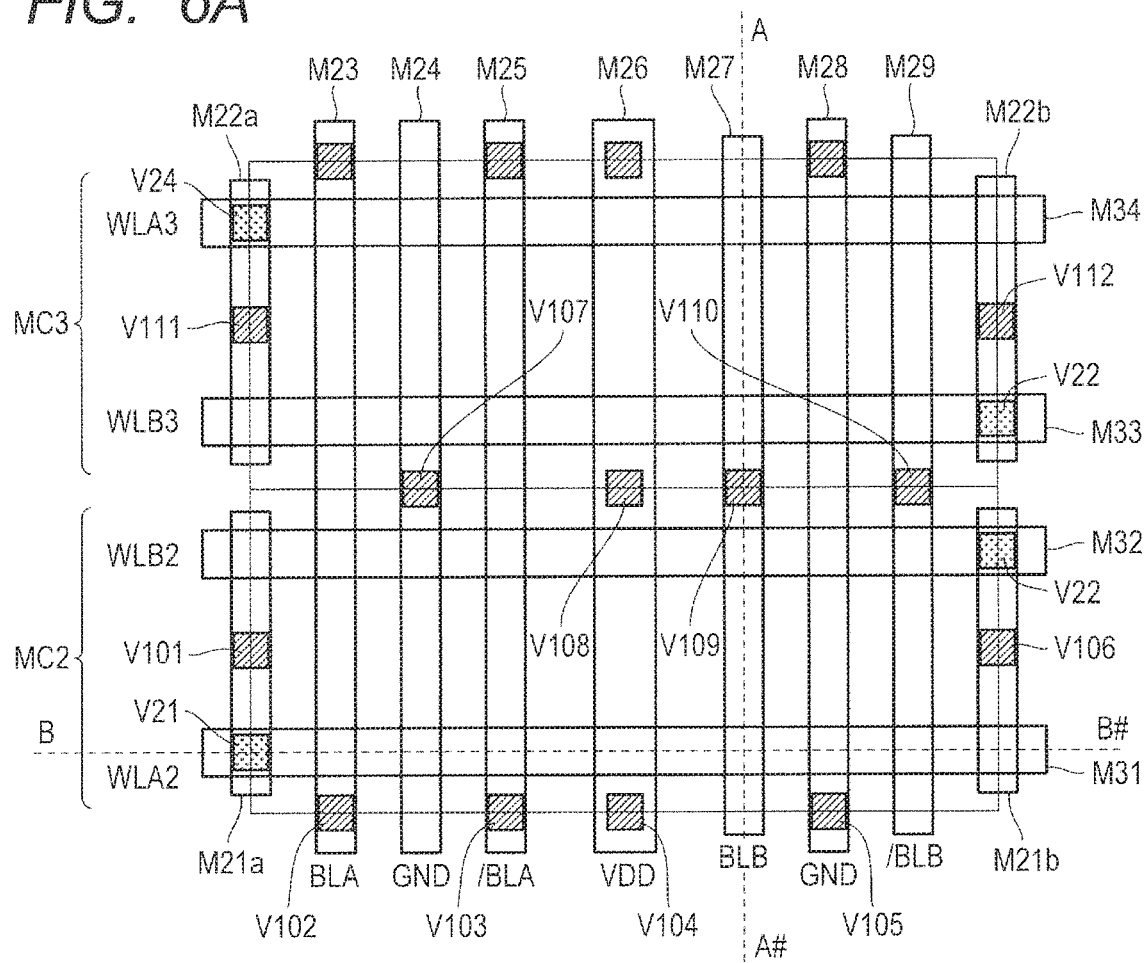
FIGS. 6A and 6B are wiring layout diagrams of an upper layer.

FIG. 6A is a wiring layout diagram of the upper layer.

FIG. 6A shows a layout configuration example of the upper layer on the configuration of FIG. 5.

Figure 6B:
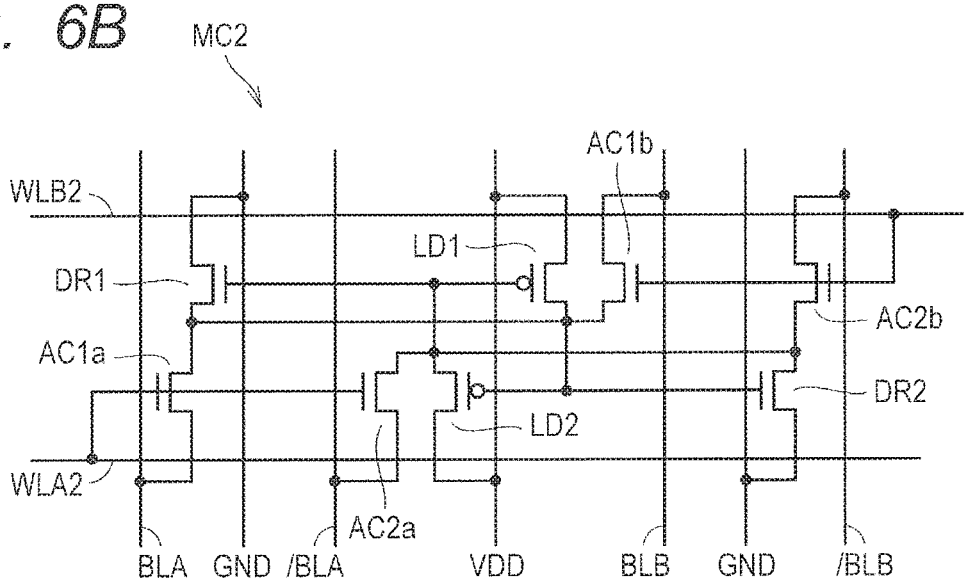

FIG. 6B is an equivalent circuit diagram showing a layout image of a combination of FIGS. 5 and 6A.

Specifically, FIG. 6A shows the layout configuration example from a first via hole to a third metal wiring layer. First, the layout configuration example of the 1-bit memory cell MC2 will be discussed below.

FIG. 5 shows the layout configuration example from a transistor formation layer to a first metal wiring layer.

Referring to FIG. 5, an N-type well region NW and two P-type well regions PW0 and PW1 that hold the N-type well region NW are formed on the surface of a semiconductor substrate. In the N-type well region NW, the load transistors LD1 and LD2 are formed as PMOS transistors.

In the P-type well region PW0, the driver transistor DR1 and the access transistors AC1a and AC2a are formed as NMOS transistors. In the P-type well region PW1, the driver transistor DR2 and the access transistors AC1b and AC2b are formed as NMOS transistors.

The load transistor LD1 has the gate of polysilicon PO1 and the source and the drain formed on both sides of the gate, the source and drain including a P-type diffusion region DP1. The source is coupled to a first metal wiring layer M101 that receives the power supply voltage VDD through a contact C101. The drain is coupled to a first metal wiring layer M102 via a contact C102.

The load transistor LD2 has the gate of polysilicon P02 and the source and the drain formed on both sides of the gate, the source and drain including a P-type diffusion region DP2. The source is coupled to a first metal wiring layer M103 that receives the power supply voltage VDD through a contact C103. The drain is coupled to a first metal wiring layer M104 via a contact C104.

The driver transistor DR1 has the gate of the polysilicon PO1 and the source and the drain formed on both sides of the gate. The gate is coupled to the gate of the load transistor LD1 and the source and drain each include an N-type diffusion region DN1. The source is coupled to a first metal wiring layer M105 that receives the ground voltage GND through two contacts C105a and C105b. The drain is coupled to the first metal wiring layer M102 via a contact C106. The first metal wiring layer M102 is also coupled to the drain of the load transistor LD1.

The access transistor AC1a has the gate of polysilicon P03 and the source and the drain formed on both sides of the gate, the source and drain including an N-type diffusion region DN2. One of the source and the drain is coupled to the first metal wiring layer M102 via a contact C107. The first metal wiring layer M102 is also coupled to the drains of the load transistor LD1 and driver transistor DR1. The other of the source and the drain is coupled to a first metal wiring layer M106 via a contact C108. The first metal wiring layer M106 is coupled to the bit line BLA.

The access transistor AC2a has the gate of the polysilicon P03 coupled to the gate of the access transistor AC1a and the source and drain formed on both sides of the gate, the source and drain including an N-type diffusion region DN3. The other of the source and the drain is coupled to the first metal wiring layer M104 via a contact C109. The first metal wiring layer M104 is also coupled to, for example, the drain of the load transistor LD2.

The other of the source and the drain is coupled to a first metal wiring layer M107 via a contact C110. The first metal wiring layer M107 is coupled to the inverted bit line /BLA.

The access transistor AC1a and the polysilicon P03 serving as the gate of the access transistor AC2a are coupled a first metal wiring layer M108 via a contact C111. The first metal wiring layer M108 is coupled to the word line WLA.

The driver transistor DR2 has the gate of the polysilicon P02 and the source and the drain formed on both sides of the gate. The gate is also coupled to the gate of the load transistor LD2 and the source and drain each include an N-type diffusion region DN4. The source is coupled to a first metal wiring layer M109 that receives the ground voltage GND through two contacts C112a and C112b. The drain is coupled to the first metal wiring layer M104 via a contact C113. The first metal wiring layer M104 is also coupled to, for example, the drain of the load transistor LD2.

The access transistor AC1b has the gate of polysilicon PO4 and the source and the drain formed on both sides of the gate, the source and drain including an N-type diffusion region DN5. One of the source and the drain is coupled to the first metal wiring layer M102 via a contact C114. The first metal wiring layer M102 is also coupled to the drains of the load transistor LD1 and driver transistor DR1.

The other of the source and the drain is coupled to a first metal wiring layer M110 via a contact C115. The first metal wiring layer M110 is coupled to the bit line BLB.

The access transistor AC2b has the gate of the polysilicon PO4 also coupled to the gate of the access transistor AC1b and the source and drain formed on both sides of the gate, the source and drain including an N-type diffusion region DN6. One of the source and the drain is coupled to the first metal wiring layer M104 via a contact C116. The first metal wiring layer M104 is also coupled to, for example, the drain of the load transistor LD2. The other of the source and the drain is coupled to a first metal wiring layer M111 via a contact C117. The first metal wiring layer M111 is coupled to the inverted bit line /BLB.

The access transistor AC1b and the polysilicon PO4 serving as the gate of the access transistor AC2b are coupled to the first metal wiring layer M112 via a contact C118. The first metal wiring layer M112 is coupled to the word line WLB.

The driver transistor DR1 and the polysilicon PO1 serving as the gate of the load transistor LD1 are coupled to the first metal wiring layer M104 via a contact C119. The first metal wiring layer M104 is electrically coupled to, for example, the drain of the load transistor LD2. The driver transistor DR2 and the polysilicon P02 serving as the gate of the load transistor LD2 are coupled to the first metal wiring layer M102 via a contact C120. The first metal wiring layer M102 is electrically coupled to, for example, the drain of the load transistor LD1.

The P-type diffusion regions DP1 and DP2 are formed by implanting a P-type impurity into the N-type well region NW with the respective polysilicon gates serving as masks. The N-type diffusion regions DN1 to DN6 are also formed by implanting an N-type impurity into the P-type well regions PW0 and PW1 with the respective polysilicon gates serving as masks.

Referring to FIG. 6A, second metal wiring layers M21a and M21b are formed on the right and left sides of the upper layer of FIG. 5, and second metal wiring layers M23 to M29 are formed like lines between the second metal wiring layers M21a and M21b. The second metal wiring layers M23 and M25 are provided for the bit line BLA and the inverted bit line /BLA, respectively. The ground voltage GND is supplied to the second metal wiring layer M24 arranged between the second metal wiring layers M23 and M25.

The second metal wiring layers M27 and M29 are provided for the bit line BLB and the inverted bit line /BLB, respectively. The ground voltage GND is supplied to the second metal wiring layer M28 arranged between the second metal wiring layers M27 and M29.

The power supply voltage VDD is supplied to the second metal wiring layer M26 arranged between the second metal wiring layers M25 and M27.

The second metal wiring layer M21a is coupled to the first metal wiring layer M108 in FIG. 5 via a first via hole V101 The second metal wiring layer M21b is coupled to the first metal wiring layer M112 in FIG. 5 via a first via hole V106. The second metal wiring layer M23 is coupled to the first metal wiring layer M106 in FIG. 5 via a first via hole V102. The second metal wiring layer M25 is coupled to the first metal wiring layer M107 in FIG. 5 via a first via hole V103. The second metal wiring layer M24 is coupled to the first metal wiring layer M105 in FIG. 5 via a first via hole V107. The second metal wiring layer M27 is coupled to the first metal wiring layer M110 in FIG. 5 via a first via hole V109. The second metal wiring layer M29 is coupled to the first metal wiring layer M111 in FIG. 5 via a first via hole V110. The second metal wiring layer M28 is coupled to the first metal wiring layer M109 in FIG. 5 via a first via hole V105. The second metal wiring layer M26 is coupled to the first metal wiring layer M103 in FIG. 5 via a first via hole V104 and is also coupled to the first metal wiring layer M101 in FIG. 5 via a first via hole V108.

In this way, the second metal wiring layers are configured such that the wire of the ground voltage GND (GND line) acts as a shield between the bit line BLA (or BLB) and the inverted bit line /BLA (or /BLB) and the wire of the power supply voltage VDD (VDD line) between the inverted bit line /BLA for the port A and the bit line BLB for the port B.

Moreover, third metal wiring layers M31 and M32 shaped like lines are formed on the second metal wiring layers. The third metal wiring layer M31 corresponds to the word line WLA2, and the third metal wiring layer M32 corresponds to the word line WLB2. The third metal wiring layer M31 is coupled to the second metal wiring layer M21a via a second via hole V21, and the third metal wiring layer M32 is coupled to the second metal wiring layer M21b via a second via hole V22.

Furthermore, the memory cell MC2 and the memory cell MC3 adjacent to the memory cell MC2 have a layout configuration that is axisymmetric with respect to the boundary between the memory cells MC2 and MC3 as shown in FIG. 5.

Thus, on the boundary, the diffusion region (DN1) acting as the source of the driver transistor DR1, the contacts (C105a, C105b), and the first metal wiring layer (M105) in the memory cell MC2 are also used as the source of the driver transistor DR1 of the memory cell MC3. Similarly, the source of the load transistor LD1 and the sources or drains of the access transistors AC1b and AC2b are also shared by the memory cells MC2 and MC3. For example, the diffusion region, the contacts, and the first metal wiring layer on the boundary (not shown) between the memory cells MC2 and MC1 are similarly shared by the memory cells MC2 and MC1.

In FIG. 6A, the memory cells MC2 and MC3 similarly have a layout configuration that is axisymmetric with respect to the boundary between the memory cells MC2 and MC3. In the memory cell MC3, as in the memory cell MC2, a second metal wiring layer M22a for coupling the word line WLA and a second metal wiring layer M22b for coupling the word line WLB are axisymmetric to the second metal wiring layers M21a and M21b in the memory cell MC2 with respect to the boundary.

Figure 7A:
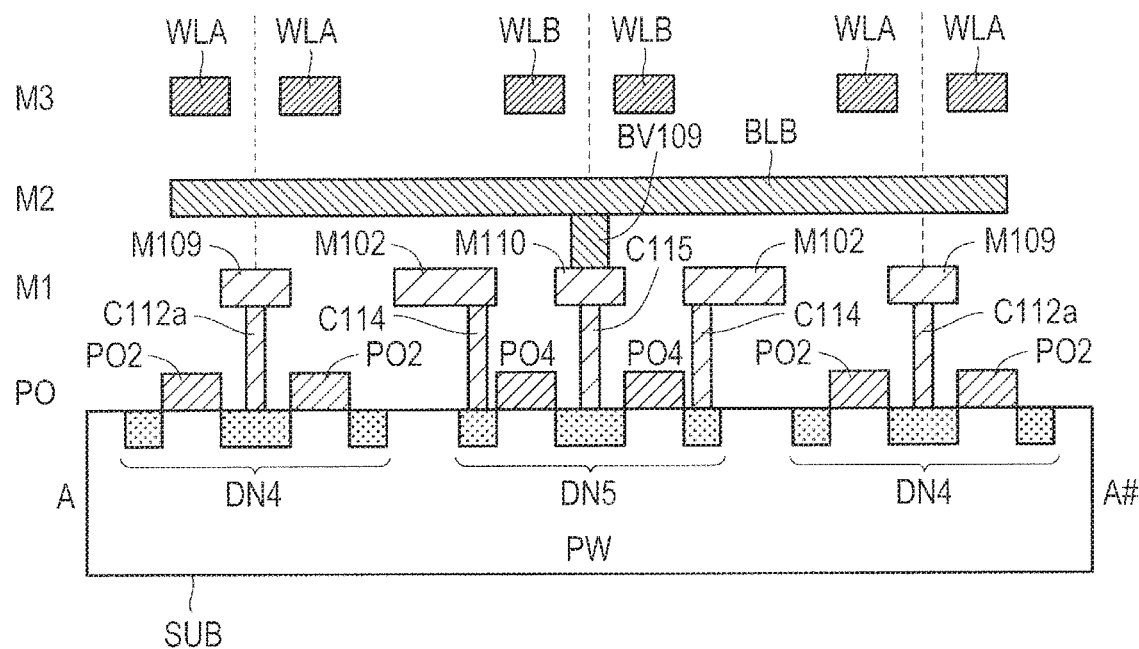
FIGS. 7A and 7B are cross-sectional configuration diagrams showing a combination of FIG. 5 and FIG. 6A.
Figure 7B:
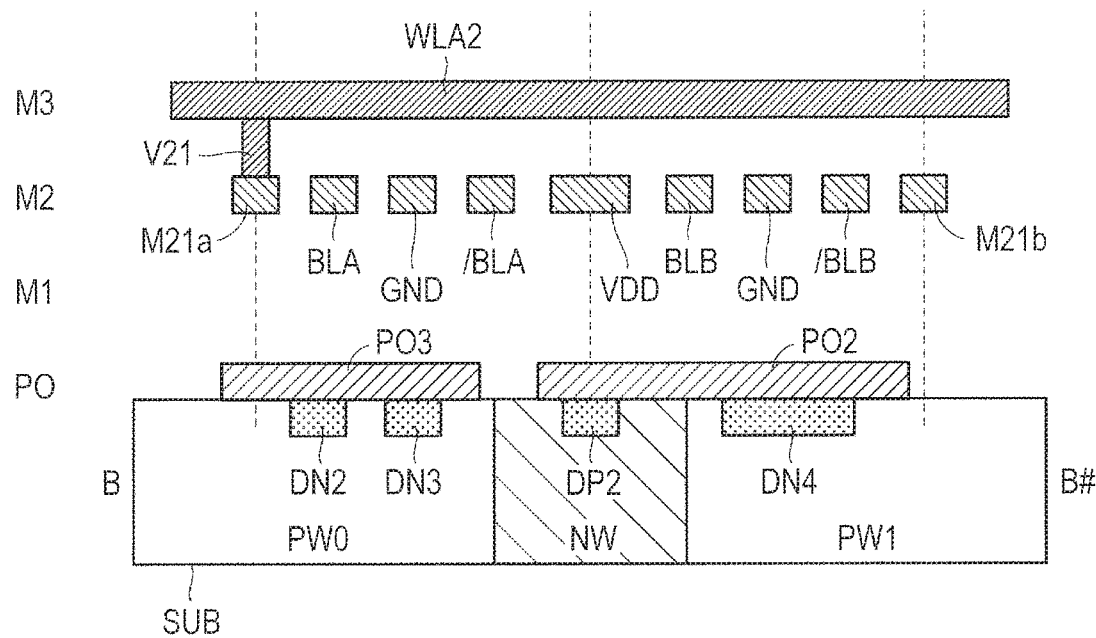

FIGS. 7A and 7B are cross-sectional configuration diagrams showing a combination of FIG. 5 and FIG. 6A.

FIG. 7A is a cross-sectional view taken along line A-A # of FIGS. 5 and 6A. FIG. 7B is a cross-sectional view taken along line B-B # of FIGS. 5 and 6A.

Referring to FIG. 7A, a P-type well region PW is formed in a semiconductor substrate SUB. The P-type well region PW contains the N-type diffusion regions DN4 and DN5, each serving as the source or drain of the NMOS transistor.

The polysilicon PO2 and the polysilicon PO4, each of which serves as the gate of the MOS transistor, are formed on the semiconductor substrate SUB. The first metal wiring layers M109, M110, and M102 are formed above the polysilicon.

The first metal wiring layers M109, M110, and M102 are coupled to the N-type diffusion regions DN4 and DN5 via the respective contacts C112a, C114, and C115.

The bit line BLB including the second metal wiring layer M2 is formed above the first metal wiring layers. The bit line BLB is coupled to the first metal wiring layer M110 via the first via hole V109. The third metal wiring layer M3 is formed above the second metal wiring layers so as to extend perpendicularly (away from a viewer) to the bit line BLB. In the third metal wiring layer M3, the word line WLA and the word line WLB are formed. In this configuration, an interval between the word lines WLA and WLB is larger than that between the word lines WLB.

In FIG. 7B, the P-type well regions Pw0 and PW1 and the N-type well region NW are formed in the semiconductor substrate SUB. The polysilicon PO2 and the polysilicon PO3, each of which serves as the gate of the MOS transistor, are formed on the semiconductor substrate SUB.

The P-type well region PW0 contains the N-type diffusion regions DN2 and DN3. The N-type well region NW contains the P-type diffusion region DP2.

The P-type well region PW1 contains the N-type diffusion regions DN4.

These diffusion regions are illustrated for convenience sake. As shown in FIG. 5, the diffusion regions are actually equivalent to the channel part of the MOS transistor having the diffusion regions on both sides.

The second metal wiring layer M2 is formed above the polysilicon. The second metal wiring layer M21a for coupling the word line WLA and the second metal wiring layer M21b for coupling the word line WLB are formed on both sides of the second metal wiring layer M2. The bit lines BLA, /BLA, BLB, and /BLB, the GND lines, and the VDD line are formed between the second metal wiring layers.

The GND lines are arranged between the bit lines BLA and /BLA and between the bit lines BLB and /BLB, respectively. The VDD line is arranged between the bit lines /BLA and BLB.

The word line WLA2 is formed as the third metal wiring layer M3 above the second metal wiring layer M2 and is couple to the second metal wiring layer M21a via the second via hole V21.

(Configuration for Reducing the Coupling Noise of the Word Line)

Figure 8:
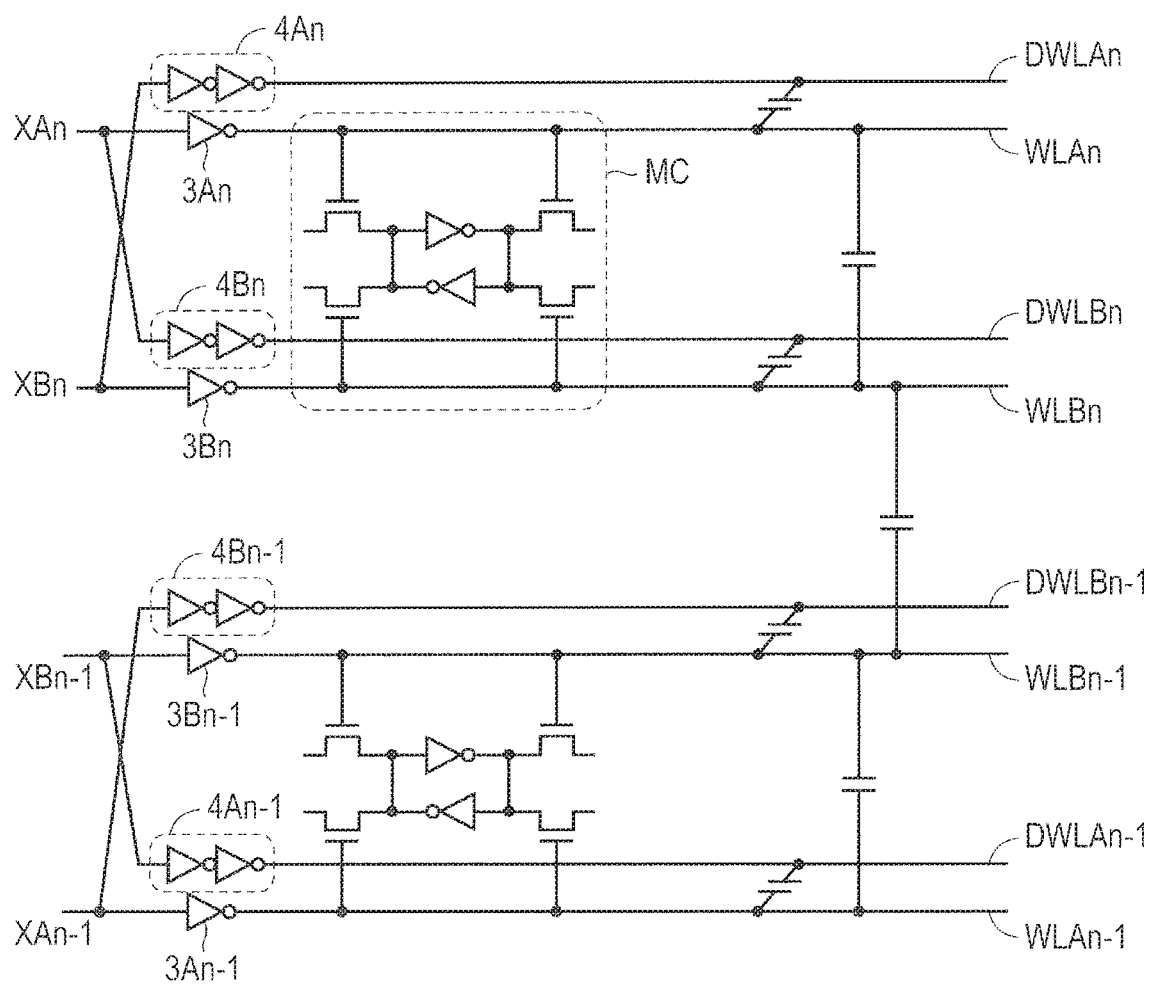
FIG. 8 is an explanatory drawing showing the configuration of dummy word lines according to the first embodiment.

FIG. 8 is an explanatory drawing showing the configuration of dummy word lines according to the first embodiment.

Referring to FIG. 8, dummy word lines DWLA are provided for the respective word lines WLA in the first embodiment. Moreover, dummy word lines DWLB are provided for the respective word lines WLB.

Specifically, the first dummy word lines DWLA are provided above the respective word lines WLA for the first port, the word lines WLA being arranged for the respective memory cell rows. Furthermore, the second dummy word lines DWLB are provided above the respective word lines WLB for the second port, the word lines WLB being arranged for the respective memory cell rows.

In this example, dummy word line DWLAn-1 is provided for the word line WLAn-1. The dummy word line DWLAn is provided for the word line WLAn. The dummy word line DWLBn-1 is provided for the word line WLBn-1 in this example. The dummy word line DWLBn is provided for the word line WLBn in this example.

Moreover, a driver circuit is provided for driving the word lines WLA and WLB and the dummy word lines DWLA and DWLB.

In this example, a word-line driver circuit is provided for driving the word lines WLA and WLB and a dummy-word-line driver circuit is provided for driving the dummy word lines DWLA and DWLB.

Inverters 3An, 3An−1, 3Bn, and 3Bn−1 drive the word lines WLAn, WLAn−1, WLBn, and WLBn−1 and include the word line driver circuit.

Inverters 4An, 4An−1, 4Bn, and 4Bn−1, each of which includes two-stage inverters, drive the dummy word lines DWLAn, DWLAn−1, DWLBn, and DWLBn−1 and include the dummy-word-line driver circuit.

The inverters 4An operate in response to a decode signal XBn like the inverter 3Bn.

Specifically, if the inverter 3Bn drives the word line WLBn at "H" level in response to the decode signal XBn ("L" level), the inverters 4An drive the dummy word line DWLAn at "L" level of opposite phase. If the inverter 3Bn sets the word line WLBn at "L" level in response to the decode signal XBn ("H" level), the inverters 4An drive the dummy word line DWLAn at "H" level of opposite phase.

Similarly, the inverters 4Bn operate in response to a decode signal XAn like the inverter 3An.

Specifically, if the inverter 3An drives the word line WLAn at "H" level in response to the decode signal XAn ("L" level), the inverters 4Bn drive the dummy word line DWLBn at "L" level of opposite phase. If the inverter 3An drives the word line WLAn at "L" level in response to the decode signal XAn ("H" level), the inverters 4Bn drive the dummy word line DWLBn at "H" level of opposite phase.

The inverters 4An−1 operate in response to a decode signal XBn−1 like the inverter 3Bn−1.

Specifically, if the inverter 3Bn−1 drives the word line WLBn−1 at "H" level in response to the decode signal XBn−1 ("L" level), the inverters 4An−1 drive the dummy word line DWLAn−1 at "L" level of opposite phase. If the inverter 3Bn−1 drives the word line WLBn−1 at "L" level in response to the decode signal XBn−1 ("H" level), the inverters 4An−1 drive the dummy word line DWLAn−1 at "H" level of opposite phase.

Similarly, the inverters 4Bn−1 operate in response to a decode signal XAn−1 like the inverter 3An−1.

Specifically, if the inverter 3An−1 drives the word line WLAn−1 at "H" level in response to the decode signal XAn−1 ("L" level), the inverters 4Bn−1 drive the dummy word line DWLBn−1 at "L" level of opposite phase. If the inverter 3An−1 drives the word line WLAn−1 at "L" level in response to the decode signal XAn−1 ("H" level), the inverters 4Bn−1 drive the dummy word line DWLBn−1 at "H" level of opposite phase.

Figure 9:
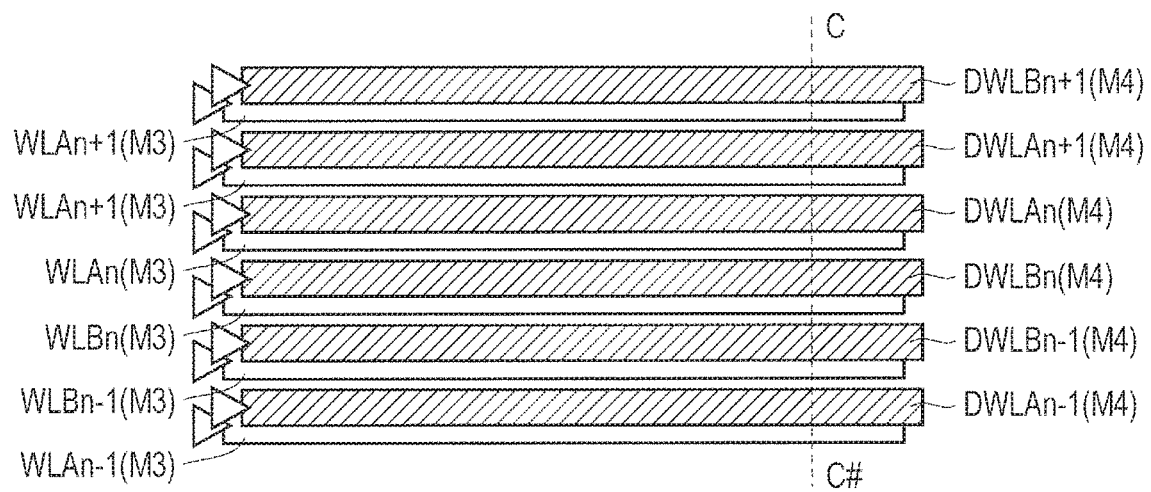
FIG. 9 is a diagram of an upper wiring layout of the dummy word lines according to the first embodiment.

FIG. 9 is a diagram of an upper wiring layout of the upper dummy word lines according to the first embodiment.

As shown in FIG. 9, the dummy word lines DWLA and DWLB are arranged above the word lines WLA and WLB. In this example, the word lines WLA and WLB are formed using the third metal wiring layer. Furthermore, the dummy word lines DWLA and DWLB are formed using the fourth metal wiring layer.

Figure 10:
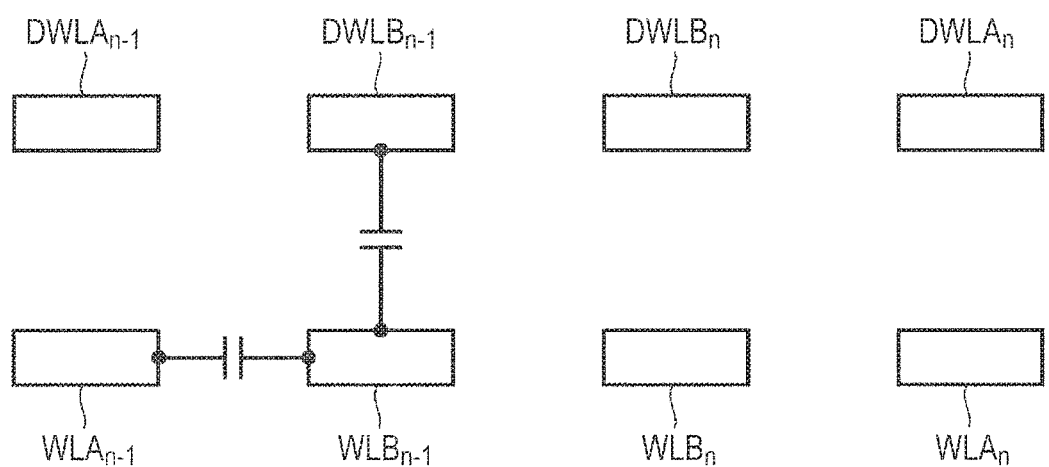
FIG. 10 is a cross-sectional view showing word lines WLA and WLB and dummy word lines DWLA and DWLB according to the first embodiment.

FIG. 10 is a cross-sectional view showing the word lines WLA and WLB and the dummy word lines DWLA and DWLB according to the first embodiment.

Referring to FIG. 10, a cross-sectional view taken along line C-C # of FIG. 9 is shown.

Specifically, the word lines WLAn−1, WLBn−1, WLBn, and WLAn are sequentially arranged from the left.

Moreover, the dummy word lines DWLA and DWLB are arranged above the word lines WLA and WLB, respectively.

Specifically, the dummy word lines DWLAn−1, DWLBn−1, DWLBn, and DWLAn are sequentially arranged from the left.

The word lines WLA and WLB operate in an asynchronous manner.

Thus, for example, if the word line WLAn−1 is driven, the word line WLBn−1 is affected by the word line WLAn−1 due to coupling noise.

In this example, when the word line WLAn−1 is driven, the influence of coupling noise on the word line WLBn−1 is canceled by the dummy word line DWLBn−1.

Figure 11:
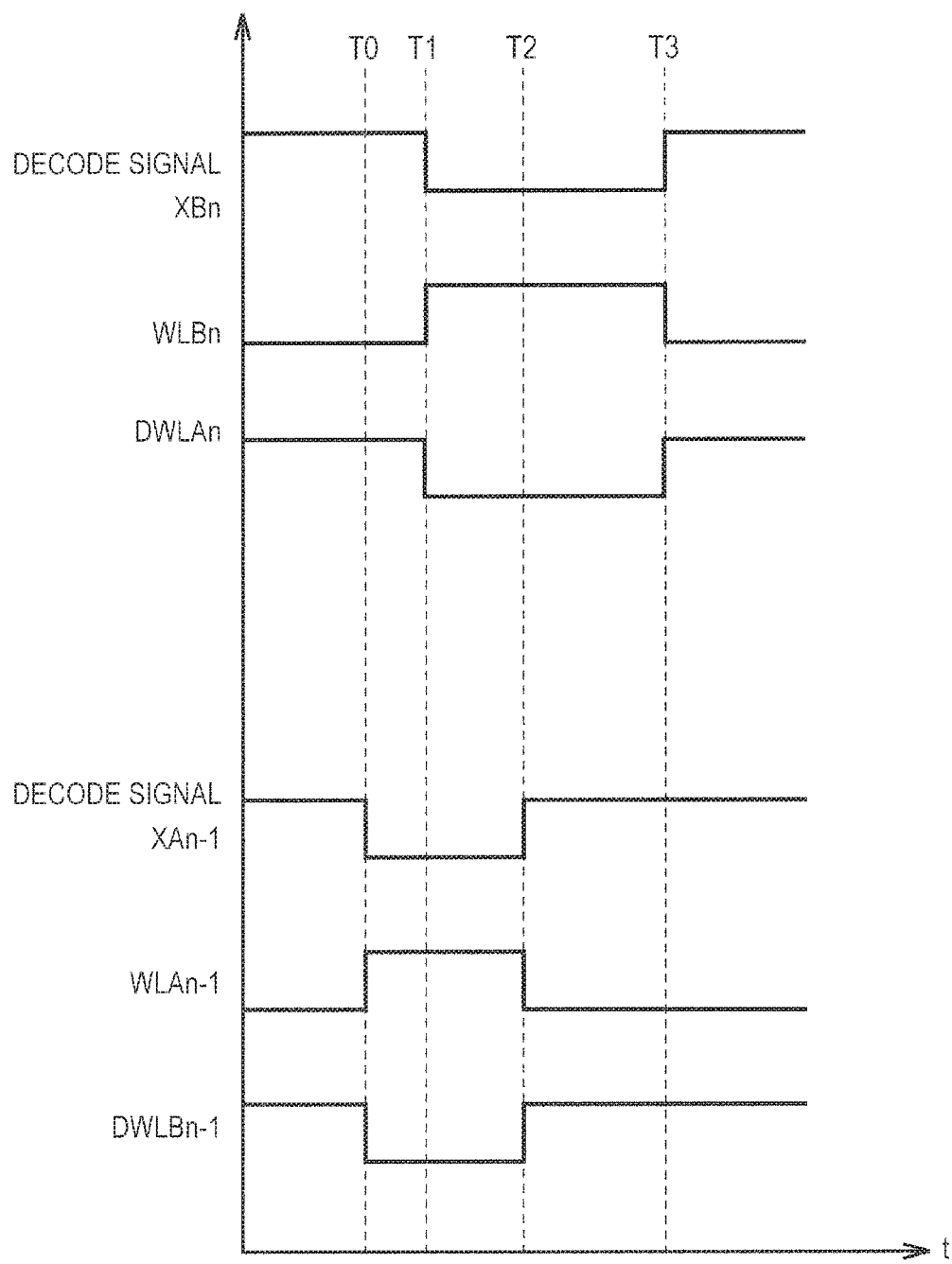
FIG. 11 is a timing chart for explaining driving of the word lines and the dummy word lines in response to decode signals according to the first embodiment.

FIG. 11 is a timing chart for explaining driving of the word lines and the dummy word lines in response to the decode signals according to the first embodiment.

Referring to FIG. 9, at time T0, the decode signal for a port A is set at "L" level. The word line WLAn−1 is driven at "H" level, accordingly.

Meanwhile, the dummy word line DWLBn−1 is driven at "L" level in response to the decode signal ("L" level) for the port A.

At time T2, the decode signal for the port A is set at "H" level. The word line WLAn−1 is lowered to "L" level, accordingly. At this point, the dummy word line DWLBn−1 is driven at "H" level in response to the decode signal ("H" level) for the port A.

With this configuration, when the word line WLAn−1 is driven at "H" level, the dummy word line DWLBn−1 next to the word line WLAn−1 is driven at "L" level. When the word line WLAn−1 is lowered to "L" level, the dummy word line DWLBn−1 next to the word line WLAn−1 is driven at "H" level.

Thus, if the word line WLAn−1 is driven, the word line WLBn−1 is affected by the word line WLAn−1 due to coupling noise corresponding to a coupling capacitance.

However, when the word line WLAn−1 is driven, the dummy word line DWLBn−1 provided for the word line WLBn−1 next to the word line WLAn−1 is driven in the opposite phase.

Thus, the word line WLAn−1 and the dummy word line DWLB−1 are driven in opposite phases, thereby canceling the influence of coupling noise corresponding to the coupling capacitance on the word line WLBn−1.

Also for a port B operating in an asynchronous manner, the word line and the dummy word line are similarly driven.

Specifically, at time T1, the decode signal for the port B is set at "L" level. The word line WLBn is driven at "H" level, accordingly.

Meanwhile, the dummy word line DWLAn is driven at "L" level in response to the decode signal ("L" level) for the port B.

At time T3, the decode signal for the port B is set at "H" level. The word line WLBn is lowered to "L" level, accordingly. At this point, the dummy word line DWLAn is driven at "H" level in response to the decode signal ("H" level) for the port B.

With this configuration, when the word line WLBn is driven at "H" level, the dummy word line DWLAn next to the word line WLBn is driven at "L" level. When the word line WLBn is lowered to "L" level, the dummy word line DWLAn next to the word line WLBn is driven at "H" level.

Thus, if the word line WLBn is driven, the word line WLAn is affected by the word line WLBn due to coupling noise corresponding to a coupling capacitance.

However, when the word line WLBn is driven, the dummy word line DWLAn provided for the word line WLAn next to the word line WLBn is driven in the opposite phase.

Thus, the word line WLBn and the dummy word line DWLAn are driven in opposite phases, thereby canceling the influence of coupling noise corresponding to the coupling capacitance for the word line WLAn.

In other words, the semiconductor device can be achieved that can reduce coupling noise while suppressing an area increase.

(First Modification)

Figure 12:
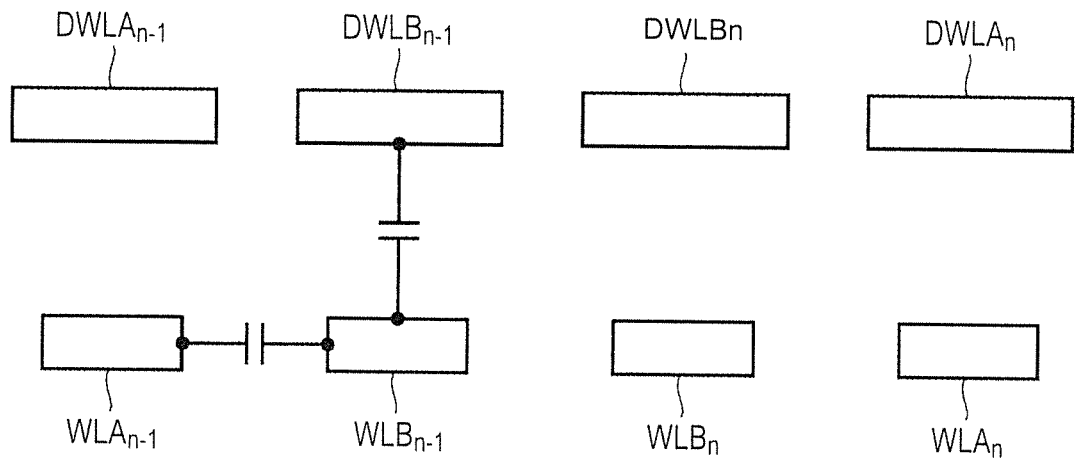
FIG. 12 is a cross-sectional view showing the word lines WLA and WLB and the dummy word lines DWLA and DWLB according to a first modification of the first embodiment.

FIG. 12 is a cross-sectional view showing the word lines WLA and WLB and the dummy word lines DWLA and DWLB according to a first modification of the first embodiment.

Referring to FIG. 12, the widths of the dummy word lines DWLA and DWLB are adjusted from the configuration of FIG. 10.

The widths of the word lines WLA and WLB and the dummy word lines DWLA and DWLB may be adjusted to different widths.

Specifically, the intervals between the word lines WLA and WLB may be different from the intervals between the word lines WLB and the dummy word lines DWLB.

Thus, the intervals between the word lines WLA and WLB are compared with the intervals between the word lines WLB and the dummy word lines DWLB. In the following description, the intervals between the word lines WLB and the dummy word lines DWLB are larger than the intervals between the adjacent word lines WLA and WLB. In this case, as shown in FIG. 12, the dummy word lines DWLA and DWLB may be larger in width than the word lines WLA and WLB such that coupling noise corresponding to a coupling capacitance provided for the word lines WLA and WLB according to the coupling capacitance for the dummy word lines DWLA and DWLB has the same influence as the coupling noise of the adjacent word lines WLB and WLA.

Alternatively, the intervals between the word lines WLA and WLB are compared with the intervals between the word lines WLB and the dummy word lines DWLB. In the following description, the intervals between the adjacent word lines WLA and WLB are larger than the intervals between the word lines WLB and the dummy word lines DWLB. In this case, the dummy word lines DWLA and DWLB may be larger in width than the word lines WLA and WLB such that coupling noise corresponding to a coupling capacitance provided for the word lines WLA and WLB by the dummy word lines DWLA and DWLB has the same influence as the coupling noise of the adjacent word lines WLB and WLA.

(Second Modification)

In the first modification, the line widths are adjusted.

Figure 13:
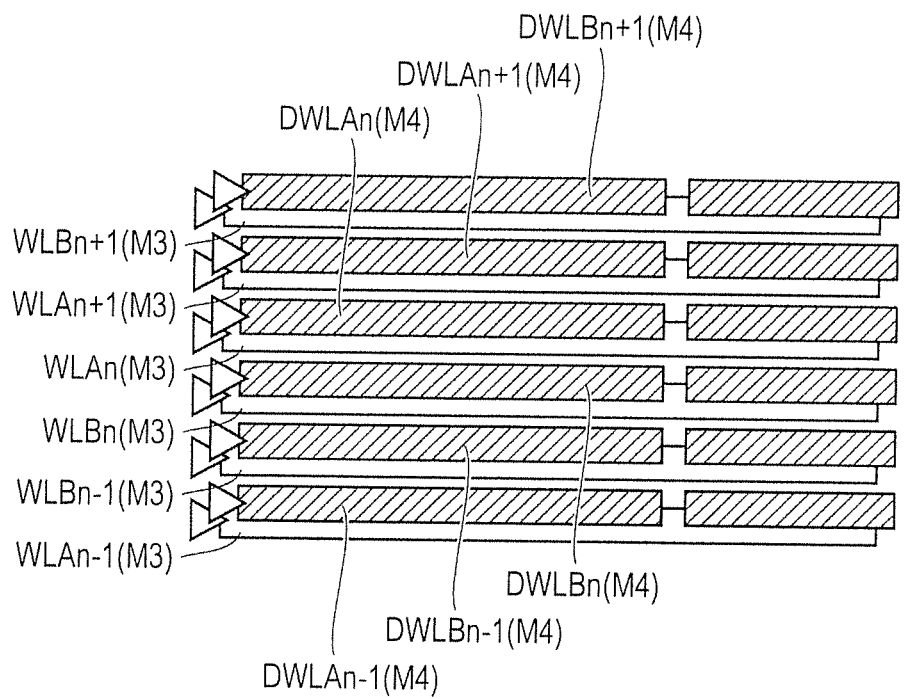
FIG. 13 is an explanatory drawing showing the layout of the word lines WLA and WLB and the dummy word lines DWLA and DWLB according to a second modification of the first embodiment.

FIG. 13 is an explanatory drawing showing the layout of the word lines WLA and WLB and the dummy word lines DWLA and DWLB according to a second modification of the first embodiment.

Referring to FIG. 13, the lengths of the dummy word lines DWLA and DWLB are adjusted from the configuration of FIG. 9.

In this modification, the dummy word lines DWLA and DWLB extended in the same direction are divided into short lengths. This can adjust a coupling capacitance.

Specifically, the intervals between the word lines WLA and WLB may be different from the intervals between the word lines WLB and the dummy word lines DWLB.

Thus, the intervals between the word lines WLA and WLB are compared with the intervals between the word lines WLB and the dummy word lines DWLB. In the following description, the intervals between the word lines WLB and the dummy word lines DWLB are larger than the intervals between the adjacent word lines WLA and WLB. In this case, as shown in FIG. 13, the dummy word lines DWLA and DWLB may be longer than the word lines WLA and WLB such that coupling noise corresponding to a coupling capacitance provided for the word lines WLA and WLB according to the coupling capacitance for the dummy word lines DWLA and DWLB has the same influence as the coupling noise of the adjacent word lines WLB and WLA. Alternatively, the dummy word lines DWLA and DWLB may be adjusted to longer lengths in order to adjust the coupling capacitance.

The coupling capacitance can be also adjusted according to the first and second modifications.

Second Embodiment

In the first embodiment, the influence of coupling noise corresponding to a coupling capacitance can be adjusted by adjusting the widths or lengths of the dummy word lines DWLA and DWLB.

In the second embodiment, the widths or lengths of dummy word lines DWLA and DWLB are adjusted according to another method so as to adjust the influence of coupling noise corresponding to a coupling capacitance.

Figure 14:
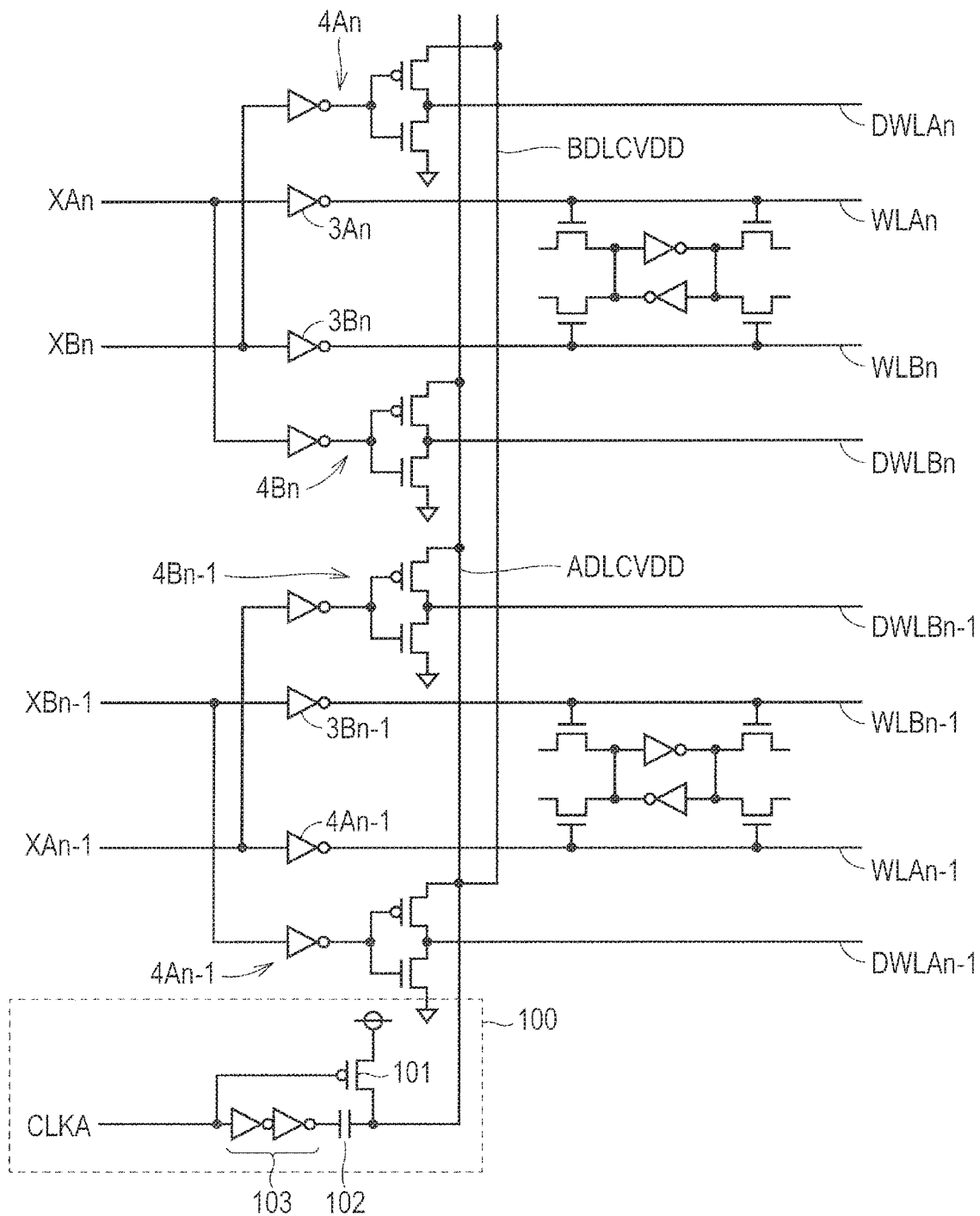
FIG. 14 is an explanatory drawing showing the configuration of a dummy-word-line driver circuit according to a second embodiment.

FIG. 14 is an explanatory drawing showing the configuration of a dummy-word-line driver circuit according to the second embodiment.

Referring to FIG. 14, the dummy-word-line driver circuit according to the second embodiment is different from the dummy-word-line driver circuit in FIG. 8 in the configurations of inverters 4A and 4B in the final stage, the inverters 4A and 4B including the dummy-word-line driver circuit.

Specifically, the inverters 4A and 4B in the final stage receive voltage supply from power supply lines ADLCVDD and BDLCVDD instead of a power supply voltage VDD.

Specifically, the inverters 4A and 4B in the final stage drive dummy word lines DWLA and DWLB according to the voltages of the power supply lines ADLCVDD and BDLCVDD.

The power supply line ADLCVDD is coupled to a booster circuit 100.

The booster circuit 100 includes a p-channel MOS transistor 101, a capacitor 102, and inverters 103.

The booster circuit 100 operates in response to the input of a control signal CLKA and supplies, to the power supply line ADLCVDD, a voltage boosted from the power supply voltage VDD.

The p-channel MOS transistor 102 is provided between the power supply voltage VDD and the power supply line ADLCVDD. The gate of the p-channel MOS transistor 102 receives the input of the control signal CLKA.

When the control signal CLKA is set at "H" level, the p-channel MOS transistor 101 is turned off. When the control signal CLKA is set at "L" level, the p-channel MOS transistor is turned on. The capacitor 102 is coupled in parallel to the p-channel MOS transistor 101 and is coupled to the inverters 103. The inverters 103 receive the input of the control signal CLKA.

In an initial state, the control signal CLKA is set at "L" level. Accordingly, the power supply voltage VDD and the power supply line ADLCVDD are coupled to each other. When the control signal CLKA is set at "H" level, the p-channel MOS transistor 101 is turned off. Then, the inverters 103 output an "H" level signal to the capacitor 102.

Charge in the capacitor 102 is released to boost the voltage of the power supply line ADLCVDD in response to the signal from the inverters 103.

The dummy word line DWLA is driven using the boosted voltage.

This can increase the influence of coupling noise from the dummy word line DWLA to a word line WLA.

Specifically, for example, the intervals between the word lines WLA and word lines WLB are compared with the intervals between the word lines WLA and the dummy word lines DWLA. In the following description, the intervals between the word lines WLA and the dummy word lines DWLA are larger than the intervals between the adjacent word lines WLA and WLB. In this case, a voltage for driving the dummy word line DWLA can be increased to be equivalent to the influence of coupling noise of the adjacent word lines WLB and WLA, so that the influence of coupling noise increases according to a coupling capacitance provided for the word line WLA from the dummy word line DWLA.

The power supply line ADLCVDD is provided for the dummy word line DWLA and the voltage of the power supply line ADLCVDD is boosted. This method is similarly applicable to the power supply line BDLCVDD. Specifically, the voltage of the power supply line BDLCVDD provided for the dummy word line DWLB is boosted, and then the dummy word line DWLB is driven by the increased voltage.

In the above explanation, the dummy word lines DWLA and DWLB are driven using the boosted voltage. The boosted voltage may be replaced with a dropped voltage. (Modification)

Figure 15:
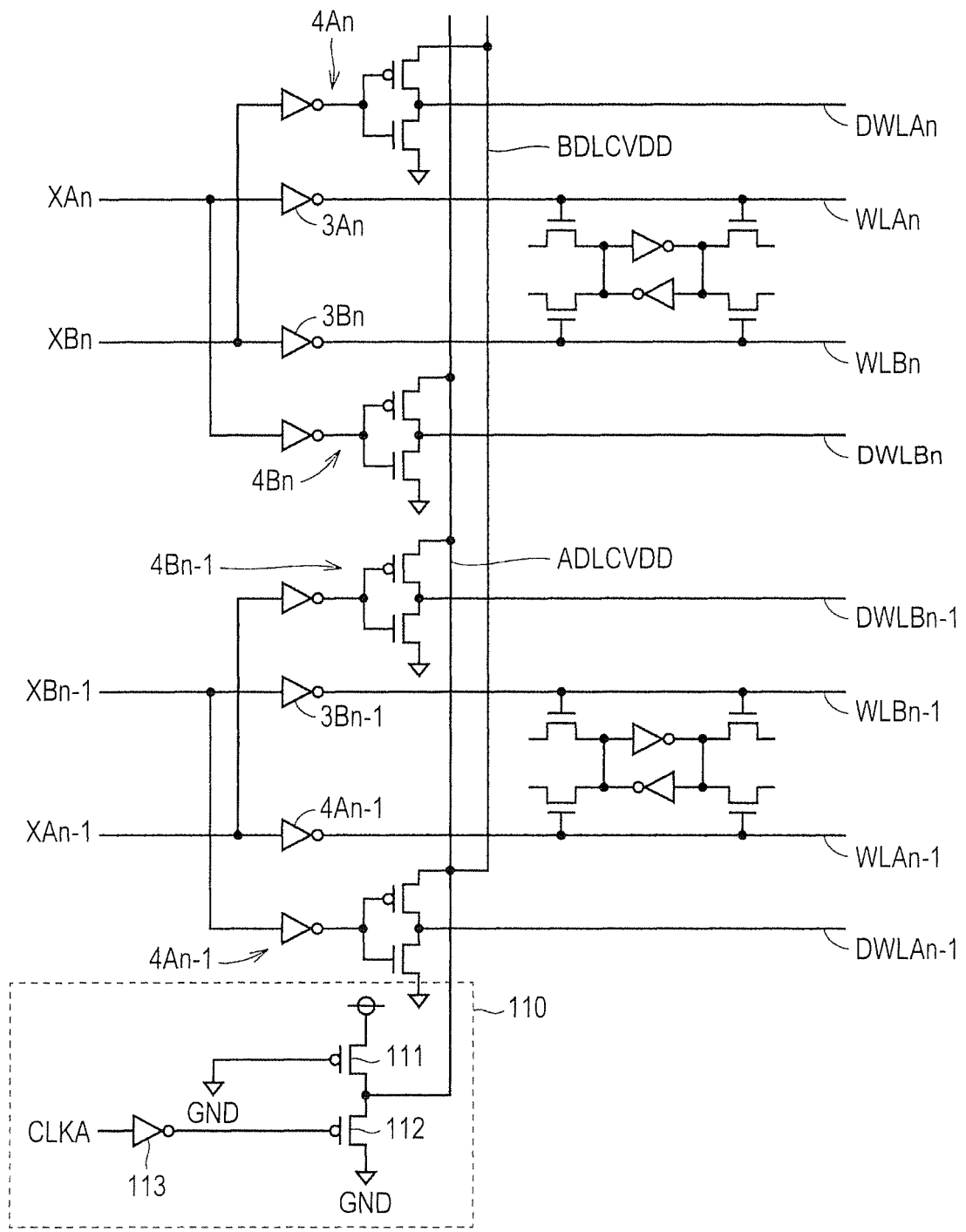
FIG. 15 is an explanatory drawing showing the configuration of a dummy-word-line driver circuit according to a modification of the second embodiment.

FIG. 15 is an explanatory drawing showing the configuration of a dummy-word-line driver circuit according to a modification of the second embodiment.

Referring to FIG. 15, the dummy-word-line driver circuit according to the modification of the second embodiment is different from the dummy-word-line driver circuit in FIG. 14 in that the booster circuit 100 is replaced with a step-down circuit 110.

Other configurations are identical to those in FIG. 14 and thus the detailed explanation thereof will not be repeated.

The step-down circuit 110 includes p-channel MOS transistors 111 and 112 and an inverter 113.

The p-channel MOS transistor 111 is provided between the power supply voltage VDD and the power supply line ADLCVDD. The p-channel MOS transistor 112 is provided between the power supply line ADLCVDD and a ground voltage GND. The gate of the p-channel MOS transistor 111 is coupled to the ground voltage GND. Thus, the p-channel MOS transistor 111 is always turned on. The gate of the p-channel MOS transistor 112 receives the input of the control signal CLKA through the inverter 113.

When the control signal CLKA is set at "H" level, the p-channel MOS transistor 112 is turned on. When the control signal CLKA is set at "L" level, the p-channel MOS transistor 112 is turned off.

Thus, the voltage level of the power supply line ADLCVDD can be adjusted by adjusting the "H"-level period of the control signal CLKA.

The longer the "H"-level period of the control signal CLKA is extended, the lower the voltage of the power supply line ADLCVDD can be dropped.

In the initial state, the control signal CLKA is set at "L" level. Accordingly, the power supply voltage VDD and the power supply line ADLCVDD are coupled to each other.

When the control signal CLKA is set at "H" level, the p-channel MOS transistor 112 is turned on. Accordingly, the voltage of the power supply line ADLCVDD is dropped.

For example, the intervals between the word lines WLA and word lines WLB are compared with the intervals between the word lines WLA and the dummy word lines DWLA. In the following description, the intervals between the adjacent word lines WLA and WLB are larger than the intervals between the word lines WLA and the dummy word lines DWLA. In this case, a voltage for driving the dummy word line DWLA can be reduced to be equivalent to the influence of coupling noise of the adjacent word lines WLB and WLA, so that the influence of coupling noise decreases according to a coupling capacitance provided for the word line WLA from the dummy word line DWLA.

The power supply line ADLCVDD is provided for the dummy word line DWLA and the voltage of the power supply line ADLCVDD is dropped. This modification is similarly applicable to the power supply line BDLCVDD. Specifically, the voltage of the power supply line BDLCVDD provided for the dummy word line DWLB is dropped, and then the dummy word line DWLB is driven by the dropped voltage.

Third Embodiment

Figure 16:
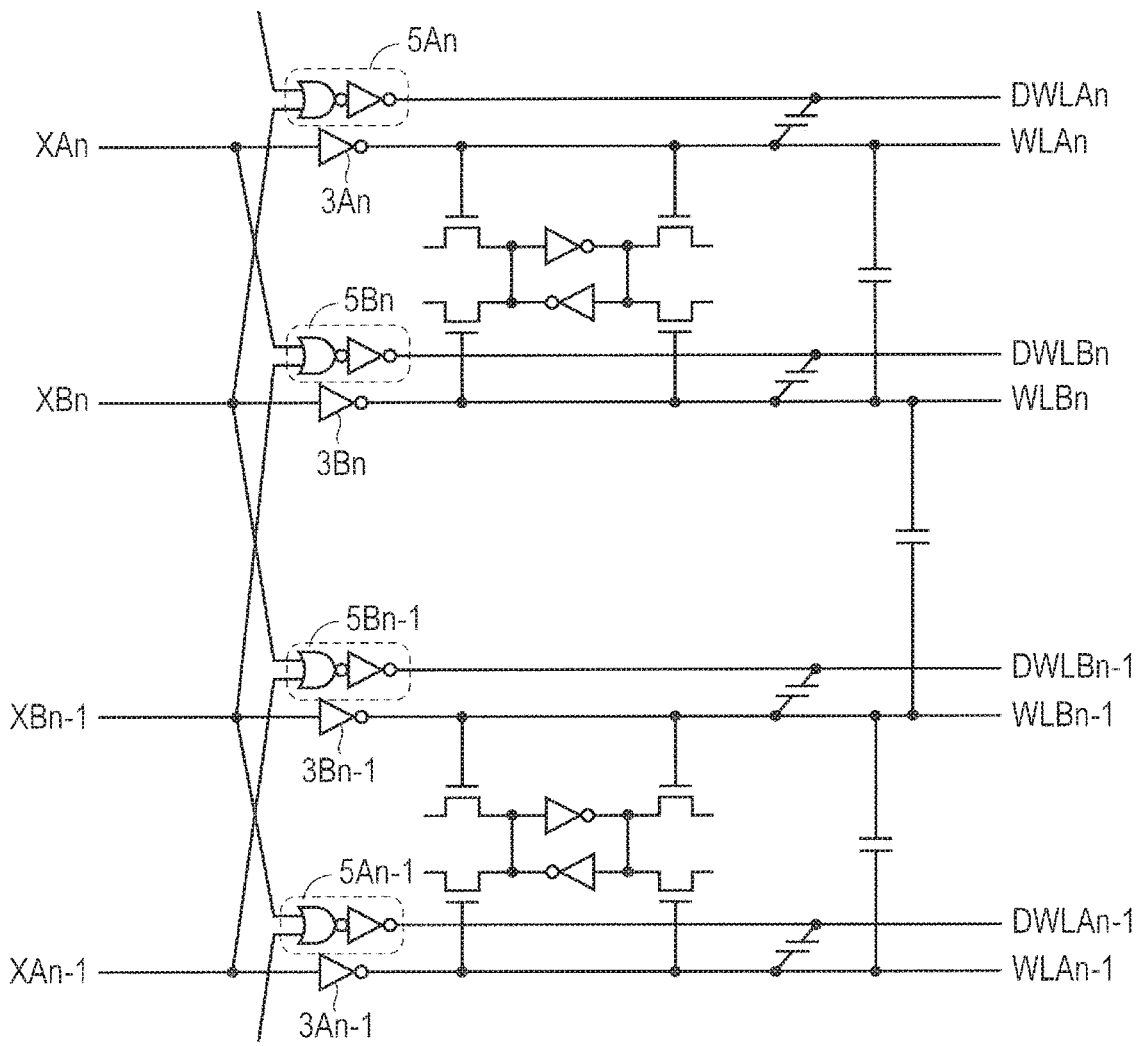
FIG. 16 is an explanatory drawing showing the configuration of dummy word lines according to a third embodiment.

FIG. 16 is an explanatory drawing showing the configuration of dummy word lines according to a third embodiment.

Referring to FIG. 16, the third embodiment is different from the configuration of the first embodiment in the order of word lines.

Specifically, two word lines WLB are adjacent to a word line WLA. In other words, the word lines WLA and WLB are alternately arranged.

The coupling noise of the word lines is reduced also in this configuration.

In the third embodiment, dummy word lines DWLA are provided for the respective word lines WLA. Moreover, dummy word lines DWLB are provided for the respective word lines WLB.

The dummy word lines according to the third embodiment are driven by synthetic circuits. Specifically, the inverters 4A and 4B are replaced with synthetic circuits 5A and 5B.

The synthetic circuits 5A and 5B include a dummy-word-line driver circuit.

The synthetic circuits 5A and 5B each include a NOR circuit and an inverter.

Specifically, the synthetic circuits 5A and 5B receive the input of a decode signal for driving the adjacent word lines. The synthetic circuits 5A and 5B drive the dummy word line DWLA and DWLB of opposite phases from the adjacent word lines WLA and WLB in response to the decode signal.

The synthetic circuit 5An operates in response to a decode signal XBn identical to that of an inverter 3Bn or the decode signal identical to that of the inverter provided for the adjacent word line.

Specifically, if the inverter 3Bn drives the word line WLBn at "H" level in response to the decode signal XBn ("L" level), the synthetic circuit 5An drives the dummy word line DWLAn at "L" level of opposite phase. If the inverter 3Bn sets the word line WLBn at "L" level in response to the decode signal XBn ("H" level), the synthetic circuit 5An drives the dummy word line DWLAn at "H" level of opposite phase.

The synthetic circuit 5Bn operates in response to a decode signal XAn identical to that of an inverter 3An or a decode signal XBn−1 identical to that of the inverter 3B-1 provided for the adjacent word line WLBn−1.

Specifically, if the inverter 3An drives the word line WLAn at "H" level in response to the decode signal XAn ("L" level), the synthetic circuit 5Bn drives the dummy word line DWLBn at "L" level of opposite phase. If the inverter 3An sets the word line WLAn at "L" level in response to the decode signal XAn ("H" level), the synthetic circuit 5Bn drives the dummy word line DWLBn at "H" level of opposite phase.

If an inverter 3Bn−1 drives the word line WLBn−1 at "H" level in response to a decode signal XBn−1 ("L" level), the synthetic circuit 5Bn drives the dummy word line DWLBn at "L" level of opposite phase. If the inverter 3Bn−1 sets the word line WLBn−1 at "L" level in response to the decode signal XBn−1 ("H" level), the synthetic circuit 5Bn drives the dummy word line DWLBn at "H" level of opposite phase.

The synthetic circuit 5Bn−1 operates in response to a decode signal XAn−1 identical to that of an inverter 3An−1 provided for the adjacent word line WLAn−1 or a decode signal XBn identical to that of the inverter 3Bn provided form the adjacent word line WLBn.

Specifically, if the inverter 3An−1 drives the word line WLAn−1 at "H" level in response to a decode signal XAn−1 ("L" level), the synthetic circuit 5Bn−1 drives the dummy word line DWLBn−1 at "L" level of opposite phase. If the inverter 3An−1 drives the word line WLAn−1 at "L" level in response to the decode signal XAn−1 ("H" level), the synthetic circuit 5Bn−1 drives the dummy word line DWLBn−1 at "H" level of opposite phase.

If the inverter 3Bn drives the word line WLBn at "H" level in response to the decode signal XBn ("L" level), the synthetic circuit 5Bn−1 drives the dummy word line DWLBn−1 at "L" level of opposite phase. If the inverter 3Bn sets the word line WLBn at "L" level in response to the decode signal XBn ("H" level), the synthetic circuit 5Bn−1 drives the dummy word line DWLBn−1 at "H" level of opposite phase.

The synthetic circuit 5An−1 operates in response to the decode signal XBn−1 identical to that of the inverter 3Bn−1 provided for the adjacent word line WLBn−1 or the decode signal identical to that of the inverter provided for the adjacent word line.

Specifically, if the inverter 3Bn−1 drives the word line WLBn−1 at "H" level in response to the decode signal XBn−1 ("L" level), the synthetic circuit 5An−1 drives the dummy word line DWLAn−1 at "L" level of opposite phase. If the inverter 3Bn−1 sets the word line WLBn−1 at "L" level in response to the decode signal XBn−1 ("H" level), the synthetic circuit 5An−1 drives the dummy word line DWLAn−1 at "H" level of opposite phase.

Figure 17:
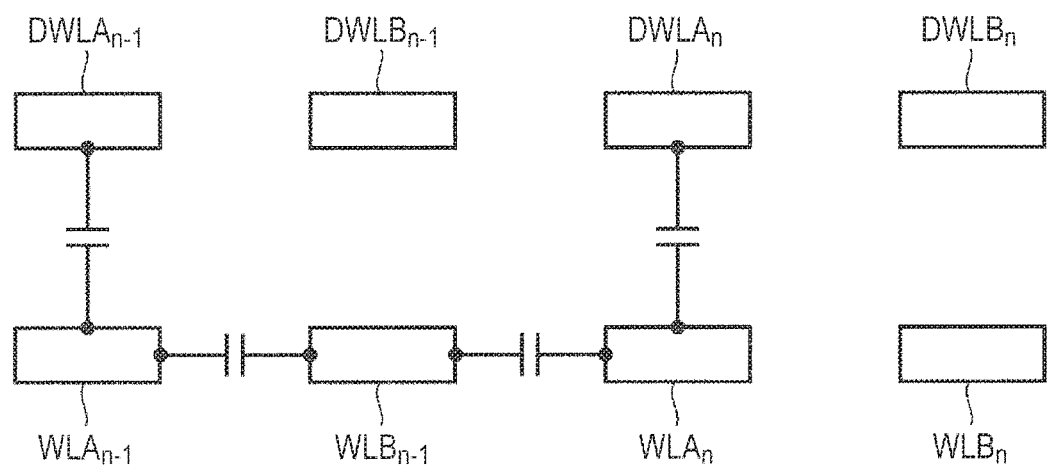
FIG. 17 is a cross-sectional view showing word lines WLA and WLB and dummy word lines DWLA and DWLB according to the third embodiment.

FIG. 17 is a cross-sectional view showing the word lines WLA and WLB and the dummy word lines DWLA and DWLB according to the third embodiment.

Referring to FIG. 17, the word lines WLAn−1, WLBn−1, WLAn, and WLBn are sequentially arranged from the left.

Moreover, the dummy word lines DWLA and DWLB are arranged above the word lines WLA and WLB, respectively.

Specifically, the dummy word lines DWLAn−1, DWLBn−1, DWLAn, and DWLBn are sequentially arranged from the left.

The word lines WLA and WLB operate in an asynchronous manner.

Thus, for example, if the word line WLBn−1 is driven, the two adjacent word lines WLAn−1 and WLAn are affected by the word line WLBn−1 due to coupling noise.

Thus, in this example, when the word line WLBn−1 is driven, the influence of coupling noise on the two adjacent word lines WLAn and WLAn−1 is canceled by the dummy word lines DWLAn and DWLAn−1, respectively.

With this configuration, when the word line WLBn−1 is driven at "H" level, the two dummy word lines DWLAn and DWLAn−1 are driven at "L" level.

When the word line WLBn−1 is lowered to "L" level, the two adjacent dummy word lines DWLAn and DWLAn−1 are driven at "H" level.

Thus, if the word line WLBn−1 is driven, the word lines WLAn and WLAn−1 are affected by the word line WLBn−1 due to coupling noise corresponding to a coupling capacitance.

However, when the word line WLBn−1 is driven, the dummy word lines DWLAn and DWLAn−1 provided for the respective two adjacent word lines WLAn and WLAn−1 are driven in opposite phases.

Thus, the word line WLBn−1 and the dummy word lines DWLAn and DWLAn−1 are driven in opposite phases, thereby canceling the influence of coupling noise corresponding to the coupling capacitance on the word lines DWLAn and WLAn−1.

This also holds true for other word lines WLA.

Fourth Embodiment

In the foregoing configuration, the dummy word lines are provided for the respective word lines WLA and WLB.

Alternatively, the dummy word lines may be shared.

Figure 18:
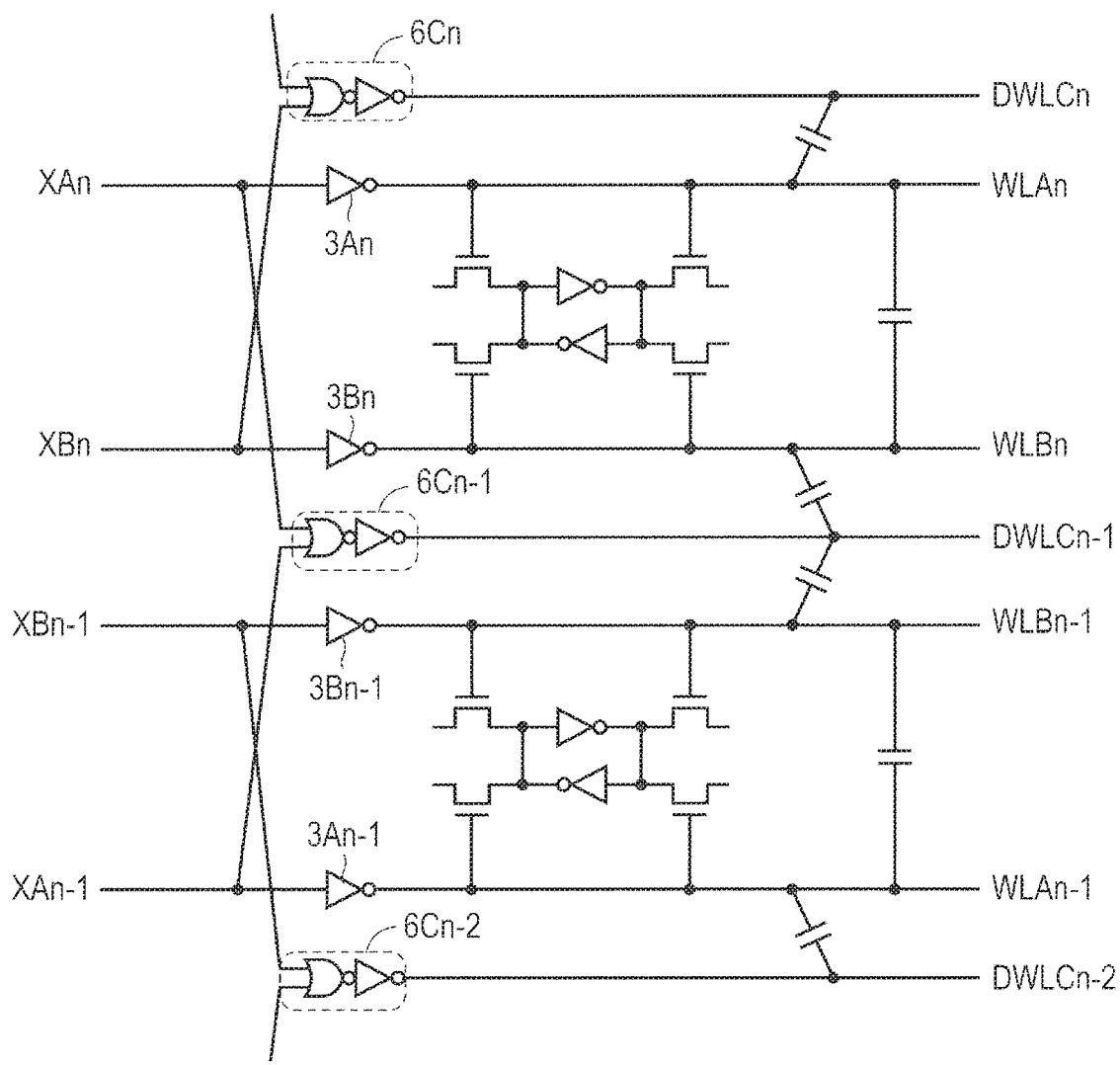
FIG. 18 is an explanatory drawing showing the configuration of dummy word lines according to a fourth embodiment.

FIG. 18 is an explanatory drawing showing the configuration of dummy word lines according to a fourth embodiment.

Referring to FIG. 18, the fourth embodiment is different from the configuration of the first embodiment in that common dummy word lines are provided.

Specifically, the common dummy word line is provided for two word lines.

In this example, a common dummy word line DWLCn−1 is provided for word lines WLBn and WLBn−1.

Moreover, a common dummy word line DWLCn−2 is provided for word lines WLAn−2 and WLAn−1.

Moreover, a common dummy word line DWLCn is provided for word lines WLAn and WLAn+1.

The coupling noise of the word lines is reduced also in this configuration.

The dummy word lines according to the fourth embodiment are driven by synthetic circuits. Specifically, the synthetic circuit 5A and 5B are replaced with a synthetic circuit 6C.

The synthetic circuit 6C includes a dummy-word-line driver circuit.

The synthetic circuits 6C includes a NOR circuit and an inverter.

Specifically, the synthetic circuit 6A receives the input of a decode signal for driving the adjacent word lines. The synthetic circuit 6C drives the dummy word line DWLC in the opposite phase from the adjacent word lines in response to the decode signal.

The synthetic circuit 6Cn−1 operates in response to a decode signal XAn identical to that of an inverter 3An provided for the word line WLAn adjacent to the two word lines WLBn and WLBn−1 or a decode signal XAn−1 identical to that of the inverter 3An−1 provided for the word line WLAn−1.

The synthetic circuit 6Cn operates in response to a decode signal XBn identical to that of an inverter 3Bn provided for the word line WLBn adjacent to the two word lines WLAn and WLAn+1 or a decode signal XAn+1 identical to that of the inverter provided for the word line WLBn+1.

The synthetic circuit 6Cn-2 operates in response to a decode signal XBn-1 identical to that of an inverter 3Bn-1 provided for the word line WLBn-1 adjacent to the two word lines WLAn-1 and WLAn-2 or a decode signal XBn-2 identical to that of the inverter provided for the word line WLBn-2.

Specifically, if the inverter 3Bn drives the word line WLBn at "H" level in response to the decode signal XBn ("L" level), the synthetic circuit 6Cn drives the dummy word line DWLCn at "L" level of opposite phase. If the inverter 3Bn sets the word line WLBn at "L" level in response to the decode signal XBn ("H" level), the synthetic circuit 6Cn drives the dummy word line DWLCn at reversed-phase "H" level.

Specifically, if the inverter 3An drives the word line WLAn at "H" level in response to the decode signal XAn ("L" level), the synthetic circuit 6Cn-1 drives the dummy word line DWLCn-1 at "L" level of opposite phase. If the inverter 3An sets the word line WLAn at "L" level in response to the decode signal XAn ("H" level), the synthetic circuit 6Cn-1 drives the dummy word line DWLCn-1 at "H" level of opposite phase.

If the inverter 3Bn-1 drives the word line WLBn-1 at "H" level in response to the decode signal XBn-1 ("L" level), the synthetic circuit 6Cn-2 drives the dummy word line DWLCn-2 at "L" level of opposite phase. If the inverter 3Bn-1 sets the word line WLBn-1 at "L" level in response to the decode signal XBn-1 ("H" level), the synthetic circuit 6Cn-2 drives the dummy word line DWLCn-2 at "H" level of opposite phase.

Specifically, if the inverter 3An-1 drives the word line WLAn-1 at "H" level in response to a decode signal XAn-1 ("L" level), the synthetic circuit 6Cn-1 drives the dummy word line DWLCn-1 at "L" level of opposite phase. If the inverter 3An-1 drives the word line WLAn-1 at "L" level in response to the decode signal XAn-1 ("H" level), the synthetic circuit 6Cn-1 drives the dummy word line DWLCn-1 at "H" level of opposite phase.

Figure 19:
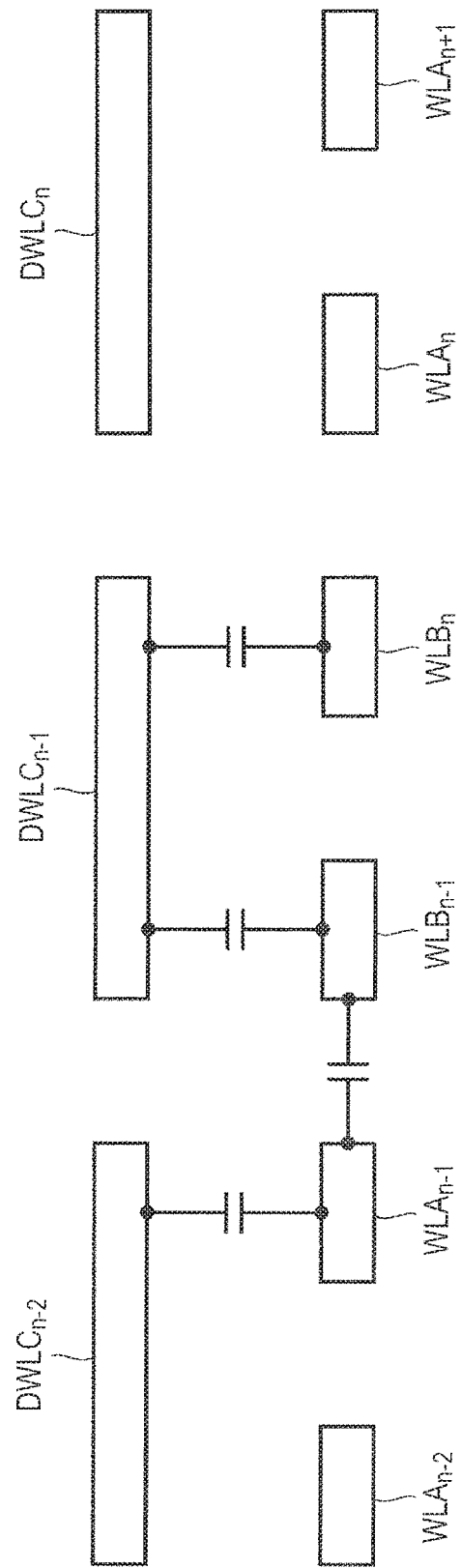
FIG. 19 is a cross-sectional view showing word lines WLA and WLB and dummy word lines DWLC according to the fourth embodiment.

FIG. 19 is a cross-sectional view showing the word lines WLA and WLB and the dummy word lines DWLC according to the fourth embodiment.

Referring to FIG. 19, the word lines WLAn-2, WLAn-1, WLBn-1, WLBn, WLAn, and WLAn-1 are sequentially arranged from the left.

Moreover, the common dummy word line DWLCn-2 is arranged for the word lines WLAn-2 and WLAn-1.

Moreover, the common dummy word line DWLCn-1 is arranged for the word lines WLBn-1 and WLBn.

Moreover, the common dummy word line DWLCn is arranged for the word lines WLAn and WLAn+1.

The word lines WLA and WLB operate in an asynchronous manner.

Thus, for example, if the word line WLBn-1 is driven, the two adjacent word lines WLAn-1 and WLAn are affected by the word line WLBn-1 due to coupling noise.

Thus, in this example, when the word line WLBn-1 is driven, the influence of coupling noise on the adjacent word line WLAn-1 is canceled by the dummy word line DWLCn-2.

When the word line WLAn-1 is driven, the influence of coupling noise on the adjacent word line WLBn-1 is canceled by the dummy word line DWLCn-1.

With this configuration, when the word line WLBn-1 is driven at "H" level, the dummy word line DWLCn-2 provided for the adjacent word line is driven at "L" level. Moreover, when the word line WLBn-1 is lowered to "L" level, the dummy word line DWLCn-2 provided for the adjacent word line is driven at "H" level.

Thus, if the word line WLBn-1 is driven, the word line WLAn-1 is affected by the word line WLBn-1 due to coupling noise corresponding to a coupling capacitance.

However, when the word line WLBn-1 is driven, the dummy word line DWLCn-2 provided for the adjacent word line WLAn-1 is driven in the opposite phase.

Thus, the word line WLBn-1 and the dummy word line DWLCn-2 are driven in opposite phases, thereby canceling the influence of coupling noise corresponding to the coupling capacitance on the word line WLAn-1.

This also holds true for other word lines WLA.

According to the present embodiment, a semiconductor device can be achieved with a large noise margin between word lines. The semiconductor device having a large noise margin can be achieved with a small area. Particularly between word lines, a noise margin for interference between ports can be extended.

Other Embodiment

A multiport memory including SRAM memory cells was described as an example. The present invention is similarly applicable to a multiport memory including DRAM memory cells. Alternatively, at least parts of the embodiments may be combined.

The present disclosure was specifically described in accordance with the foregoing embodiments. Obviously, the present disclosure is not limited to the embodiments and various changes can be made within the scope of the disclosure.

What is claimed is:

1. A semiconductor device comprising:
a memory cell arranged in each of rows and columns;
a plurality of first word lines for a first port, arranged in the rows, respectively, and arranged in a first wiring layer;
a plurality of second word lines for a second port, arranged in rows, respectively, and arranged in the first wiring layer;
a plurality of first dummy word lines arranged in a second wiring layer which is different from the first wiring layer;
a plurality of second dummy word lines arranged in the second wiring layer;
a word line driver which drives the plurality of first word lines and the plurality of second word lines; and
a dummy word line driver driving 1) one of the plurality of second dummy word lines corresponding to one of the plurality of second word lines which is adjacent to one of the plurality of first word lines, and 2) one of the plurality of first dummy word lines corresponding to the one of the plurality of first word lines which is adjacent to the one of the plurality of second word lines,
wherein the dummy word line driver drives the one of the plurality of second dummy word lines in an opposite phase of the one of the plurality of first word lines, and drives the one of the plurality of first dummy word lines in an opposite phase of the one of the plurality of second word lines.

2. The semiconductor device according to claim 1, wherein the one of the plurality of first dummy word lines and the one of the plurality of second dummy word lines are larger in width than the one of the plurality of first word lines and the one of the plurality of second word lines, respectively.

3. The semiconductor device according to claim 1,
wherein the plurality of first dummy word lines and the plurality of second dummy word lines are extended in the same direction as the plurality of first word lines and the plurality of second word lines, and
wherein each of the one of the plurality of first dummy word lines and the one of the plurality of second dummy word lines are divided into predetermined lengths.

4. The semiconductor device according to claim 1,
wherein the word line driver drives the plurality of first word lines and the plurality of second word lines at a first voltage, and
wherein the dummy word line driver drives the plurality of first dummy word lines and the plurality of second dummy word lines at a second voltage higher than the first voltage.

5. The semiconductor device according to claim 1,
wherein the word line driver drives the plurality of first word lines and the plurality of second word lines at a first voltage, and
wherein the dummy word line driver drives the plurality of first and dummy word lines and the plurality of second dummy word lines at a second voltage lower than the first voltage.

6. The semiconductor device according to claim 1, wherein the first and second word lines are alternately arranged.

7. The semiconductor device according to claim 1, wherein adjacent two of the plurality of first word lines and adjacent two of the plurality of second word lines are alternately arranged.

8. The semiconductor device according to claim 1,
wherein the plurality of first dummy word lines are arranged above the plurality of first word lines, and
wherein the plurality of second dummy word lines are arranged above the plurality of second word lines.

* * * * *